(12) United States Patent
Yoshida et al.

(10) Patent No.: US 6,680,960 B2
(45) Date of Patent: Jan. 20, 2004

(54) SEMICONDUCTOR LASER DEVICE HAVING A DIFFRACTION GRATING ON A LIGHT EMISSION SIDE

(75) Inventors: Junji Yoshida, Tokyo (JP); Naoki Tsukiji, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/983,249

(22) Filed: Oct. 23, 2001

(65) Prior Publication Data

US 2002/0163948 A1 Nov. 7, 2002

(30) Foreign Application Priority Data

May 1, 2001 (JP) .......................... 2001-134545

(51) Int. Cl.[7] ................................ H01S 5/00
(52) U.S. Cl. ............................. 372/45; 372/46
(58) Field of Search ..................... 372/45, 46, 108, 372/43, 75, 50, 54

(56) References Cited

U.S. PATENT DOCUMENTS

| | | | | |
|---|---|---|---|---|
| 4,885,753 A | * | 12/1989 | Okai et al. ................... 372/45 |
| 4,896,325 A | * | 1/1990 | Coldren ........................ 372/20 |
| 5,155,737 A | * | 10/1992 | Ikeda et al. ................... 372/43 |
| 5,184,247 A | * | 2/1993 | Schimpe ...................... 359/344 |
| 5,379,318 A | * | 1/1995 | Weber .......................... 372/96 |
| 5,459,747 A | * | 10/1995 | Takiguchi et al. ............ 372/50 |
| 5,621,828 A | * | 4/1997 | Baets et al. ................... 385/14 |
| 5,642,371 A | * | 6/1997 | Tohyama et al. ............. 372/45 |
| 5,659,562 A | * | 8/1997 | Hisa ............................. 372/96 |
| 5,845,030 A | * | 12/1998 | Sasaki et al. ................. 385/88 |
| 5,960,023 A | * | 9/1999 | Takahashi ..................... 372/96 |
| 5,991,061 A | * | 11/1999 | Adams et al. ................ 359/188 |
| 6,108,362 A | * | 8/2000 | Adams et al. ................ 372/50 |
| 6,175,581 B1 | * | 1/2001 | Sato ............................. 372/44 |
| 6,236,500 B1 | * | 5/2001 | Suzuki et al. ............. 359/337.5 |
| 6,252,895 B1 | * | 6/2001 | Nitta et al. .................... 372/50 |
| 6,282,340 B1 | * | 8/2001 | Nasu et al. .................... 385/37 |
| 6,285,477 B1 | * | 9/2001 | Miyazaki et al. ........... 359/124 |
| 6,384,963 B2 |   | 5/2002 | Ackerman et al. |
| 6,408,014 B1 | * | 6/2002 | Ackerman et al. ............ 372/32 |
| 6,438,150 B1 | * | 8/2002 | Yoo .............................. 372/49 |
| 6,453,105 B1 | * | 9/2002 | Johnson et al. .............. 385/129 |
| 6,455,338 B1 | * | 9/2002 | Takagi et al. ................. 438/24 |
| 6,483,955 B2 | * | 11/2002 | Shiozaki et al. .............. 385/10 |
| 2003/0021314 A1 | * | 1/2003 | Yoshida et al. ............... 372/45 |
| 2003/0035455 A1 | * | 2/2003 | Steffens ........................ 372/50 |

\* cited by examiner

*Primary Examiner*—Paul Ip
*Assistant Examiner*—Tuan Nguyen
(74) *Attorney, Agent, or Firm*—Oblon, Spivak, McClelland, Maier & Neustadt, P.C.

(57) ABSTRACT

A semiconductor device and method for providing a light source suitable for use as a pumping light source in a Raman amplification system are provided. The device upon which the method is based includes an active layer configured to radiate light; a light reflecting facet positioned on a first side of the active layer; a light emitting facet positioned on a second side of the active layer thereby forming a resonant cavity between the light reflecting facet and the light emitting facet; and a partial diffraction grating having a predetermined length and positioned on a light emission side of the resonator. The predetermined length of the partial diffraction grating is selected such that the semiconductor device emits a light beam having a plurality of longitudinal modes within a predetermined spectral width of an oscillation wavelength spectrum of the semiconductor device. The predetermined length of the partial diffraction grating may be set in relation to a length of the resonant cavity, or in relation to a coupling coefficient κi of the partial diffraction grating.

46 Claims, 25 Drawing Sheets

$3200\mu m \geqq L \geqq 800\mu m$

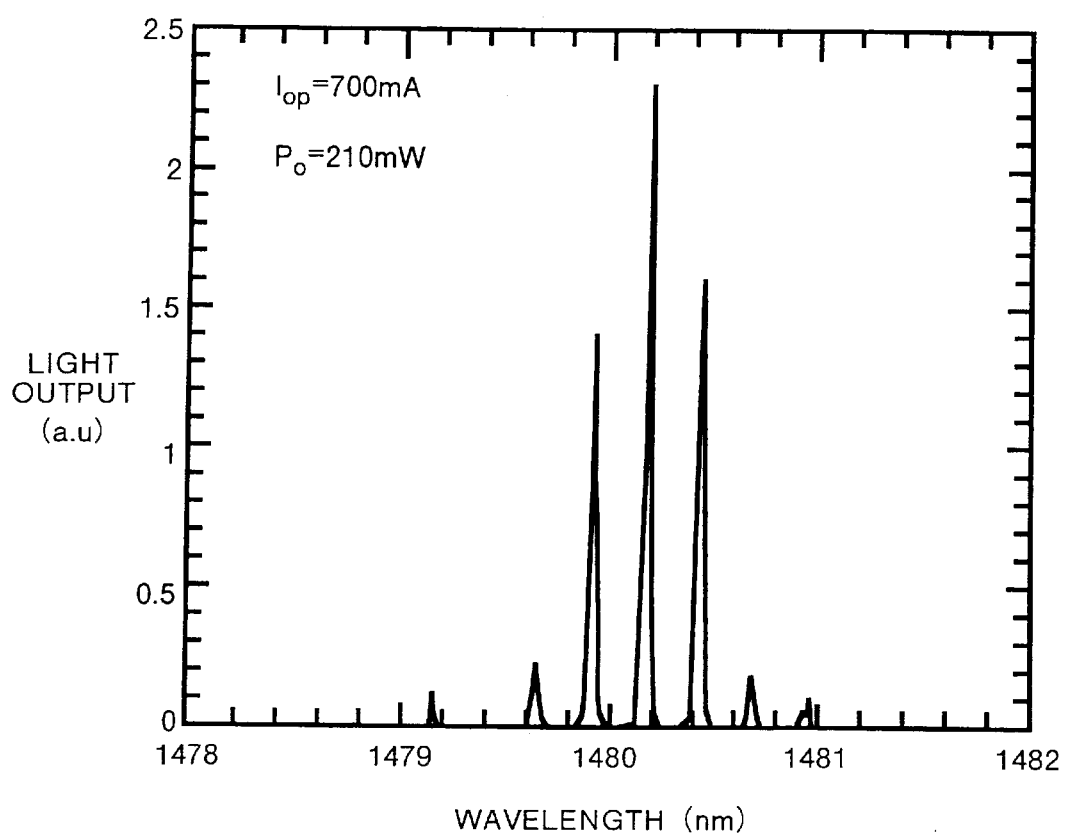

FIG. 8

| THICKNESS BETWEEN DIFFRACTION GRATING AND GRIN-SCH LAYER dsp(nm) | THICKNESS OF DIFFRACTION GRATING tgr(nm) | DIFFRACTION GRATING COMPOSITION WAVELENGTH $\lambda gr(\mu m)$ | COUPLING COEFFICIENT $\kappa i(cm^{-1})$ | DIFFRACTION GRATING LENGTH Lg($\mu m$) | | | | |
|---|---|---|---|---|---|---|---|---|
| | | | | 30 | 60 | 100 | 200 | 400 |
| 200 | 20 | 1.1 | 11 | ▲ ($\kappa iLg=0.03$) | ○ ($\kappa iLg=0.06$) | ○ ($\kappa iLg=0.1$) | △ ($\kappa iLg=0.2$) | × ($\kappa iLg=0.4$) FIGURE 11 |
| 200 | 20 | 1.25 | 20 | ○ ($\kappa iLg=0.06$) FIGURE 9 | ○ ($\kappa iLg=0.12$) | △ ($\kappa iLg=0.2$) FIGURE 10 | × ($\kappa iLg=0.7$) | × ($\kappa iLg=0.8$) |
| 100 | 25 | 1.35 | 44 | — | — | × ($\kappa iLg=0.4$) | × ($\kappa iLg=0.8$) | × ($\kappa iLg=1.6$) |

○:SUPERIOR LINEARITY IN I-L CHARACTERISTICS
△:COMPARATIVELY SUPERIOR LINEARITY IN I-L CHARACTERISTICS
×:INFERIOR LINEARITY IN I-L CHARACTERISTICS
▲:INFERIOR DRAWING OPERATION OF WAVELENGTH

FIG.13

| THICKNESS BETWEEN DIFFRACTION GRATING AND GRIN-SCH LAYER dsp(nm) | THICKNESS OF DIFFRACTION GRATING tgr(nm) | DIFFRACTION GRATING COMPOSITION WAVELENGTH λgr(um) | COUPLING COEFFICIENT κi(cm⁻¹) | DIFFRACTION GRATING LENGTH Lg(um) | κi×Lg |
|---|---|---|---|---|---|
| 50 | 30 | 1.05 | 17.3 | 60 | |
| | | 1.1 | 24.4 | 40 | 0.10 |
| 300 | 10 | 1.15 | 5.2 | 190 | |
| | | 1.2 | 6.2 | 160 | |
| 100 | 10 | 1.25 | 12.2 | 40 | 0.05 |
| | | 1.35 | 15.8 | 30 | |
| 200 | 20 | 1 | 4.8 | 110 | |
| | | 1.3 | 23 | 20 | |

FIG.19

| THICKNESS BETWEEN DIFFRACTION GRATING AND GRIN-SCH LAYER dsp(nm) | THICKNESS OF DIFFRACTION GRATING tgr(nm) | DIFFRACTION GRATING COMPOSITION WAVELENGTH $\lambda gr(\mu m)$ | COUPLING COEFFICIENT $\kappa i(cm^{-1})$ | DIFFRACTION GRATING LENGTH Lg($\mu m$) | |
|---|---|---|---|---|---|
| | | | | 100 | 50+50 ($\Lambda_1$) ($\Lambda_2$) |
| 200 | 20 | 1.1 | 11 | ◯ ($\kappa iLg=0.1$) | — |
| 200 | 20 | 1.25 | 20 | △ ($\kappa iLg=0.2$) | ◯ |
| 100 | 25 | 1.35 | 44 | × ($\kappa iLg=0.4$) | — |

◯:SUPERIOR LINEARITY IN I-L CHARACTERISTICS
△:COMPARATIVELY SUPERIOR LINEARITY IN I-L CHARACTERISTICS
×:INFERIOR LINEARITY IN I-L CHARACTERISTICS

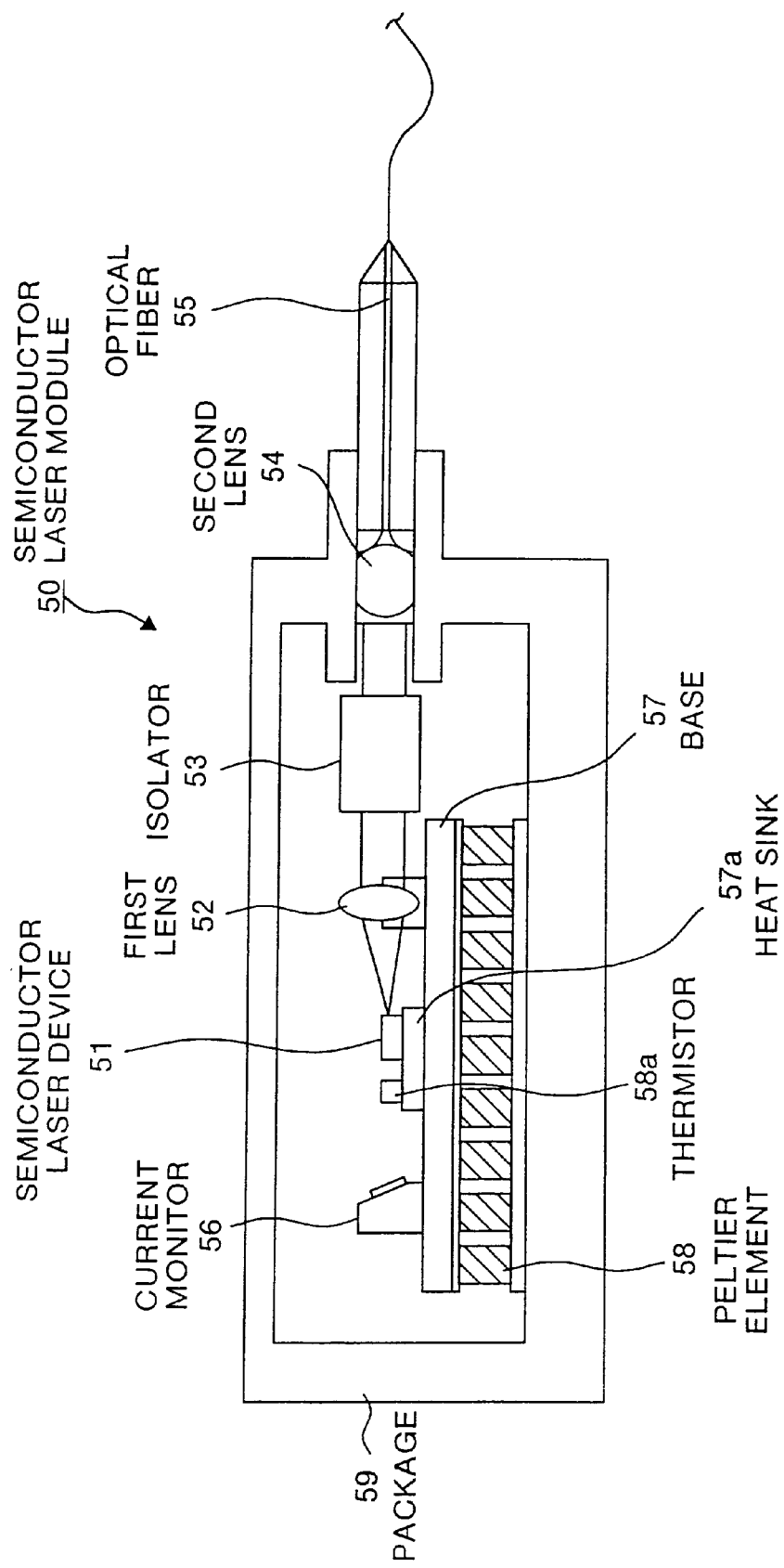

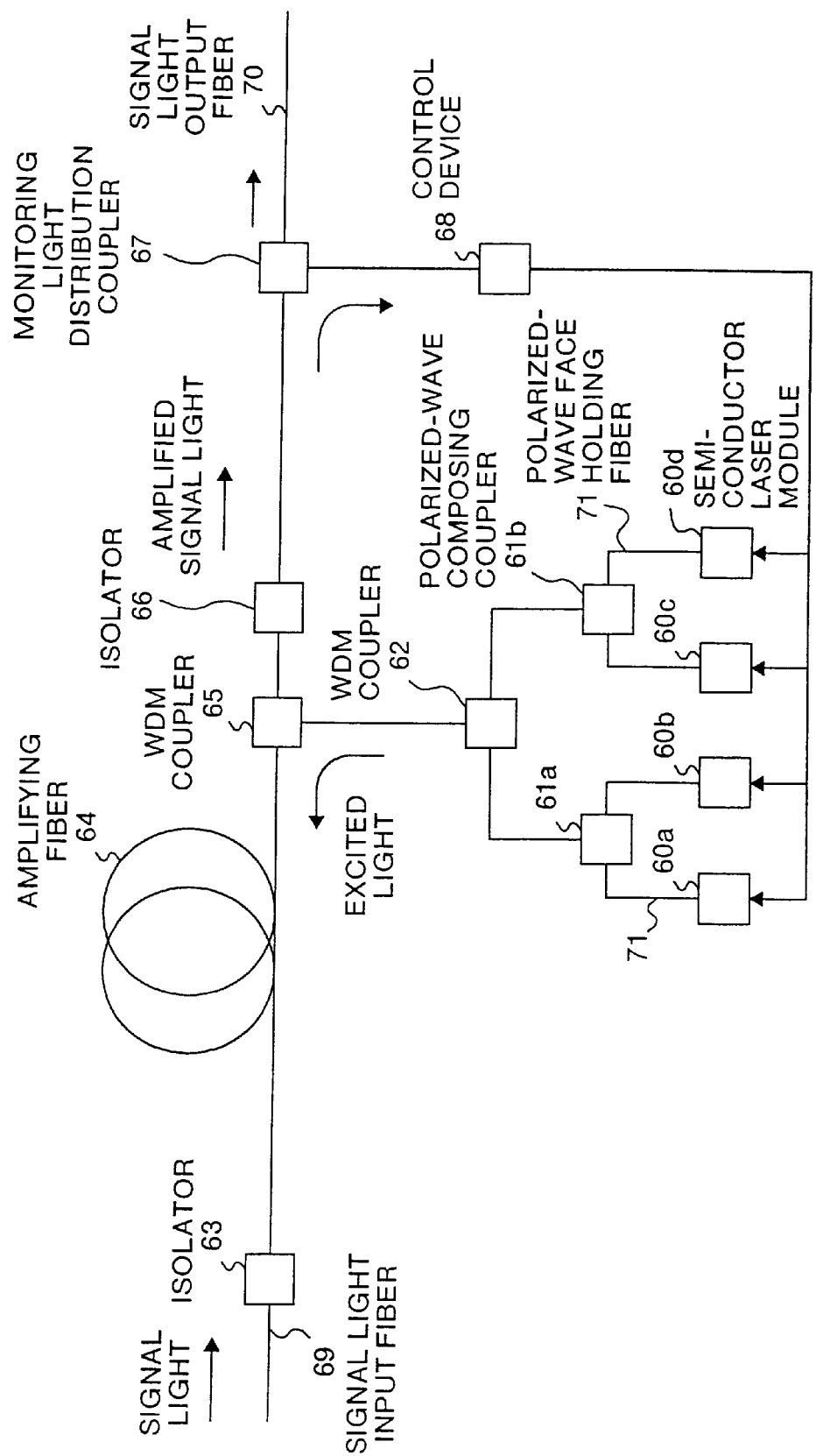

SEMICONDUCTOR LASER DEVICE HAVING A DIFFRACTION GRATING ON A LIGHT EMISSION SIDE

BACKGROUND OF THE INVENTION

1. Field of the Invention

The present invention relates to a semiconductor laser device for use in a semiconductor laser module suitable as an excitation light source for a Raman amplification system, and more particularly to a semiconductor laser device having a diffraction grating on a light emission side.

2. Discussion of the Background

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

Although the Raman amplifier amplifies signals over a wide wavelength band, the gain of a Raman amplifier is relatively small and, therefore, it is preferable to use a high output laser device as a pumping source. However, merely increasing the output power of a single mode pumping source leads to undesirable stimulated Brillouin scattering and increased noises at high peak power values. Therefore, the Raman amplifier requires a pumping source laser beam having a plurality of oscillating longitudinal modes. As seen in FIGS. 25A and 25B, stimulated Brillouin scattering has a threshold value $P_{th}$ at which the stimulated Brillouin scattering is generated. For a pumping source having a single longitudinal mode as in the oscillation wavelength spectrum of FIG. 25A, the high output requirement of a Raman amplifier, for example 300 mw, causes the peak output power of the single mode to be higher than $P_{th}$ thereby generating undesirable stimulated Brillouin scattering. On the other hand, a pumping source having multiple longitudinal modes distributes the output power over a plurality of modes each having relatively a low peak value. Therefore, as seen in FIG. 25B, a multiple longitudinal mode pumping source having the required 300 mw output power can be acquired within the threshold value $P_{th}$ thereby eliminating the stimulated Brillouin scattering problem and providing a larger Raman gain.

In addition, because the amplification process in a Raman amplifier is quick to occur, when a pumping light intensity is unstable, a Raman gain is also unstable. These fluctuations in the Raman gain result in fluctuations in the intensity of an amplified signal which is undesirable for data communications. Therefore, in addition to providing multiple longitudinal modes, the pumping light source of a Raman amplifier must have relatively stable intensity.

Moreover, Raman amplification in the Raman amplifier occurs only for a component of signal light having the same polarization as a pumping light. That is, in the Raman amplification, since an amplification gain has dependency on a polarization, it is necessary to minimize an influence caused by the difference between a polarization of the signal light beam and that of a pumping light beam. While a backward pumping method causes only a small polarization dependency because the difference in polarization state between the signal light and the counter-propagating pumping light is averaged during transmission, a forward pumping method has a strong dependency on a polarization of pumping light because the difference in polarization between the two co-propagating waves is preserved during transmission. Therefore, where a forward pumping method is used, the dependency of Raman gain on a polarization of pumping light must be minimized by polarization-multiplexing of pumping light beams, depolarization, and other techniques for minimizing the degree of polarization (DOP). In this regard it is known that the multiple longitudinal modes provided by the pumping light source help to provide this minimum degree of polarization.

When applying a Raman amplifier to the WDM communication system, the amplification gain characteristic of the Raman Amplifier sometimes needs to be altered in accordance with the number of wavelengths of the input signal light beam. For this reason, the excitation laser source for the Raman amplifier must have a high-output operation with a wide dynamic range. That is, the present inventors have recognized that in addition to multimode operation, it is required that a desired oscillation spectrum of the excitation laser device is maintained over the entire driving range of the device. Under this condition, the oscillation spectrum of the laser device will remain relatively constant and maintain a nearly Gaussian profile for all driving currents in the driving range of the device.

FIG. 26 is a block diagram illustrating a configuration of the conventional Raman amplifier used in a WDM communication system. In FIG. 26, semiconductor laser modules 182a through 182d, include paired Fabry-Pérot type semiconductor light-emitting elements 180a through 180d having fiber gratings 181a through 181d respectively. The laser modules 182a and 182b output laser beams having the same wavelength via polarization maintaining fiber 71 to polarization-multiplexing coupler 61a. Similarly, the laser modules 182c and 182d output laser beams having the same wavelength via polarization maintaining fiber 71 to polarization-multiplexing coupler 61b. Each polarization maintaining fiber 71 constitutes a single thread optical fiber which has a fiber grating 181a–181d inscribed on the fiber. The polarization-multiplexing couplers 61a and 61b respectively output the polarization-multiplexed laser beams to a WDM coupler 62. These laser beams outputted from the polarization-multiplexing couplers 61a and 61b have different wavelengths.

The WDM coupler 62 multiplexes the laser beams outputted from the polarization-multiplexing couplers 61a and 61b, and outputs the multiplexed light beams as a pumping light beam to external isolator 60, which outputs the beam to amplifying fiber 64 via WDM coupler 65. Signal light beams to be amplified are input to amplifying fiber 64 from signal light inputting fiber 69 via polarization-independent isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70. The control circuit 68 performs feedback control of a light-emitting state, such as, an optical intensity, of each of the semiconductor light-emitting elements 180a through 180d based on the portion of the amplified signal light beams input to the control circuit 68 such that the resulting Raman amplification gain is flat over wavelength.

FIG. 27 is an illustration showing a general configuration of a conventional fiber grating semiconductor laser module 182a–182d used in the conventional Raman amplifier system of FIG. 26. As seen in FIG. 27, semiconductor laser module 201 includes a semiconductor light-emitting element (laser diode) 202 and an optical fiber 203. The semiconductor light-emitting element 202 has an active layer 221 provided with a light reflecting surface 222 at one end thereof, and a light irradiating surface 223 at the other end. Light beams generated inside the active layer 221 are reflected on the light reflecting surface 222 and output from the light irradiating surface 223.

Optical fiber 203 is disposed on the light irradiating surface 223 of the semiconductor light-emitting element 222, and is optically coupled with the light irradiating surface 223. Fiber grating 233 is formed at a position of a predetermined distance from the light irradiating surface 223 in a core 232 of the optical fiber 203, and the fiber grating 233 selectively reflects light beams of a specific wavelength. That is, the fiber grating 233 functions as an external resonator between the fiber grating 233 and the light reflecting surface 222, and selects and amplifies a laser beam of a specific wavelength which is then output as an output laser beam 241.

While the conventional fiber grating semiconductor laser module 182a–182d provides the multiple longitudinal modes necessary for use in a Raman amplifier, the fiber grating laser module of FIG. 27 is problematic in that it has a large value of relative intensity noise (RIN) which reflects large fluctuations in light intensity. As discussed above, this fluctuation in the pumping light intensity is undesirable for Raman amplification because it could generate a fluctuation in Raman gain which in turn causes the amplified signal to fluctuate. The large value RIN is especially undesirable for Raman amplifiers using a forward pumping method, where the signal light of weakened intensity and the pumping light of high intensity propagate in the same direction. Therefore, even though the conventional fiber grating laser module provides multiple longitudinal modes which allow a diminished degree of polarization as needed in a forward pumping method, the forward pumping method is not frequently used with the fiber grating laser module because of the large RIN of such module.

Moreover, the present inventors have recognized that, although the fiber grating laser module of FIG. 27 provides an oscillation wavelength spectrum having multiple longitudinal modes, the oscillation wavelength spectrum is not maintained over the entire driving range of the module. More specifically, with certain driving currents applied to the laser device 202 of FIG. 27, the oscillation wavelength spectrum provided by the fiber grating 233 will lose the desired shape. Therefore, the fiber grating laser module of FIG. 27 does not provide the wide dynamic range required of a WDM communication system as described above.

The mechanical structure of the fiber grating laser module also causes instability of the conventional pumping light source. Specifically, because the optical fiber 203 with fiber grating 233 is laser-welded to the package, mechanical vibration of the device or a slight shift of the optical fiber 203 with respect to the light emitting element 202 could cause a change in oscillating characteristics and, consequently, an unstable light source. This shift in the alignment of the optical fiber 203 and light emitting element 202 is generally caused by changes in ambient temperature. In this regard, such changes in ambient temperature also cause small changes in oscillation wavelength selected by the fiber grating 233, further contributing to instability of the pumping light source.

Yet another problem associated with the fiber grating laser module is the large loss caused by the need for an external isolator. In a laser module with a fiber grating, an isolator cannot be intervened between the semiconductor laser device and the optical fiber because the external cavity oscillation is governed by the reflection from the fiber grating. That is, the isolator would prevent the reflected light from the grating from returning to the semiconductor laser device. Therefore, the fiber grating laser module has a problem in that it is susceptible to reflection and easily influenced. Moreover, as seen in FIG. 26, a Raman amplifier system using the fiber grating laser module must use external isolator 60. As is known in the art, this isolator presents a relatively large loss to the pumping light.

SUMMARY OF THE INVENTION

Accordingly, one object of the present invention is to provide a laser device and method for providing a light source suitable for use as a pumping light source in a Raman amplification system, but which overcomes the above described problems associated with a fiber grating laser module.

Another object of the present invention is to provide a laser device having a wavelength oscillation spectrum that is maintained over the entire current driving range of the semiconductor device.

According to a first aspect of the present invention, a semiconductor device and method for providing a light source suitable for use as a pumping light source in a Raman amplification system are provided. The device upon which the method is based includes an active layer configured to radiate light; a light reflecting facet positioned on a first side of the active layer; a light emitting facet positioned on a second side of the active layer thereby forming a resonant cavity between the light reflecting facet and the light emitting facet; and a partial diffraction grating having a predetermined length and positioned on a light emission side of the resonator. The predetermined length of the partial diffraction grating is selected such that the semiconductor device emits a light beam having a plurality of longitudinal modes within a predetermined spectral width of an oscillation wavelength spectrum of the semiconductor device.

The predetermined length of the partial diffraction grating may be set in relation to a length of the resonant cavity, or in relation to a coupling coefficient κi of the partial diffraction grating. In the former situation, the predetermined length of the diffraction grating is set to meet the inequality:

$$Lg \times (1300/L) \leq 300 (\mu m),$$

where Lg is the predetermined length of the partial diffraction grating in $\mu$m, and L is the length of the resonant cavity in $\mu$m. Where the predetermined length is set in relation to the coupling coefficient κi, the predetermined length of the diffraction grating is set to meet the inequality:

$$\kappa i \cdot Lg \leq 0.3,$$

where κi is the coupling coefficient of the diffraction grating, and Lg is the length of the diffraction grating.

The partial diffraction grating has a thickness tgr, a distance from the active layer dsp, and a bandgap wavelength of diffraction grating λgr, and at least one of the parameters tgr, dsp, and λgr is a predetermined value such that the coupling coefficient κi is set in relation to the grating length Lg. The partial diffraction grating of the semiconductor device includes a plurality of grating elements having a constant pitch, or may be formed as a chirped grating. Where a chirped grating is formed, a fluctuation in the pitch of the plurality of grating elements may be a random fluctuation or a periodic fluctuation.

According to another aspect of the invention, a semiconductor laser module, an optical amplifier, a Raman amplifier, or a wavelength division multiplexing system may be provided with a semiconductor laser device having an active layer configured to radiate light; a light reflecting facet positioned on a first side of the active layer; a light emitting facet positioned on a second side of the active layer thereby forming a resonant cavity between the light reflecting facet and the light emitting facet; and a partial diffraction grating having a predetermined length and positioned on a light emission side of the resonator. The predetermined length of the partial diffraction grating is selected such that the semiconductor device emits a light beam having a plurality of longitudinal modes within a predetermined spectral width of an oscillation wavelength spectrum of the semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A is a spectrum diagram of a laser device constructed in accordance with one embodiment of the present invention;

FIG. 8 is a table that summarizes the I-characteristics of laser devices tested by varying physical parameters shown in FIG. 7 in accordance with the present invention;

FIG. 13 is a table indicating the physical characteristics of various laser devices that provide a desirable κi·Lg of 0.1 or 0.05 according to embodiments of the present invention;

FIG. 19 is a drawing that shows the results of measurements on the I-L characteristics of a device having the diffraction gratings shown in FIG. 18;

FIG. 20 is a vertical sectional view illustrating a configuration of a semiconductor laser module in accordance with the present invention;

FIG. 21 is a block diagram illustrating a configuration of a Raman amplifier in which polarization dependency is canceled by polarization-multiplexing of pumping light beams output from two semiconductor laser devices, in accordance with an embodiment of the present invention;

FIG. 26 is a block diagram illustrating a general configuration of a conventional Raman amplifier.

DETAILED DESCRIPTION OF THE PREFERRED EMBODIMENTS

Figure 1:
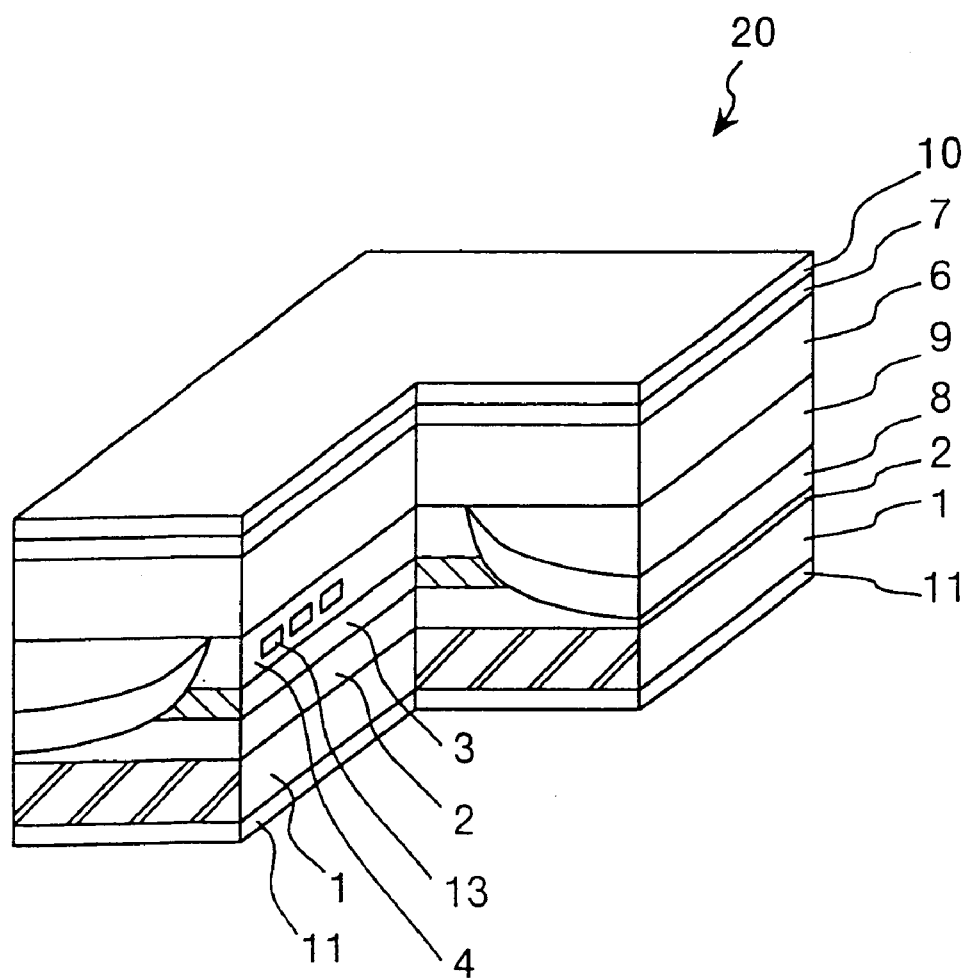
FIG. 1 is a broken perspective view showing a general configuration of a semiconductor laser device according to an embodiment of the present invention.
Figure 2:
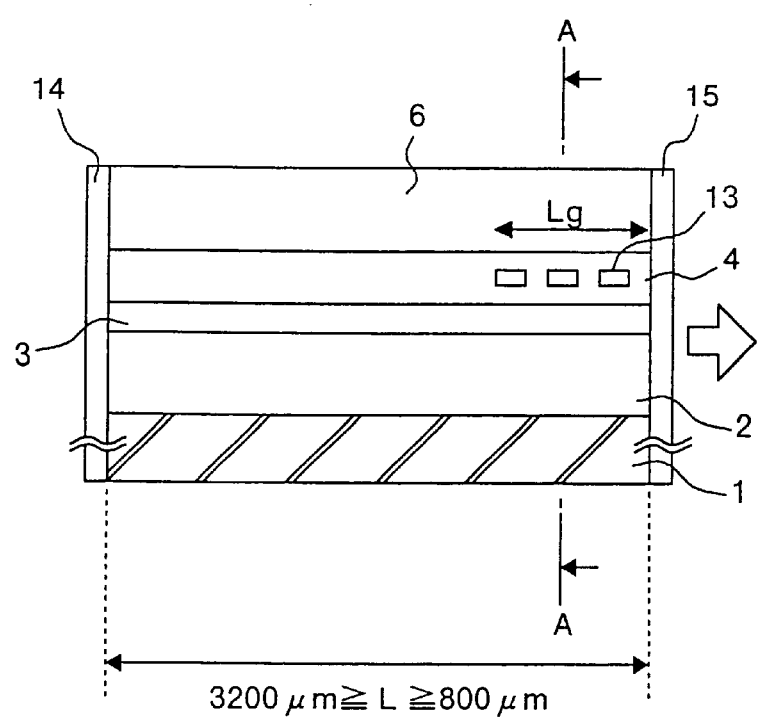
FIG. 2 is a vertical sectional view in the longitudinal direction of the semiconductor laser device shown in FIG. 1.
Figure 3:
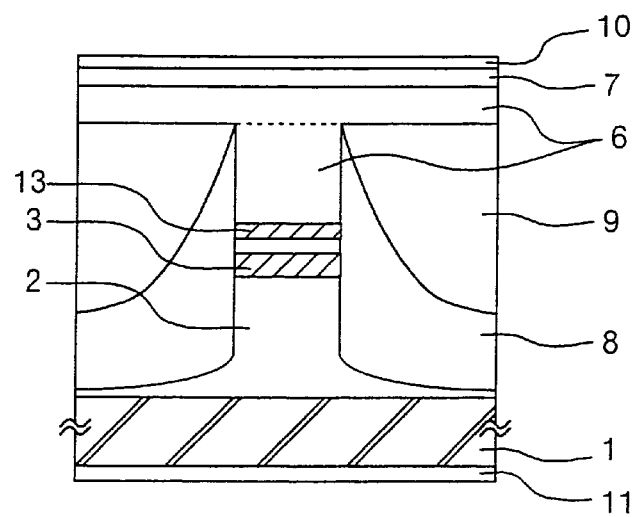
FIG. 3 is a cross sectional view of the semiconductor laser device, taken along the line A—A of the semiconductor laser device shown in FIG. 2.

Referring now to the drawings wherein like elements are represented by the same reference designation throughout, and more particularly to FIGS. 1, 2 and 3 thereof, there is shown a semiconductor laser device for providing a light source suitable for use as a pumping light source in a Raman amplification system in accordance with an embodiment of the present invention. FIG. 1 is a broken perspective view showing a general configuration of a semiconductor laser device according to an embodiment of the present invention. FIG. 2 is a vertical sectional view in the longitudinal direction of the semiconductor laser device shown in FIG. 1, and FIG. 3 is a cross sectional view of the semiconductor laser device, taken along the line A—A in FIG. 2.

The semiconductor laser device 20 of FIGS. 1–3 includes an n-InP substrate 1 having an n-InP buffer layer 2, an active layer 3, a p-InP spacer layer 4, a p-InP cladding layer 6, and an InGaAsP cap layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW) and has a compressive strain. A diffraction grating 13 of a p-InGaAsP material is periodically formed within the p-InP spacer layer 4 along a portion of the entire length of active layer 3 The diffraction grating 13 of the embodiment of FIG. 1 has a film thickness of 20 nm, a pitch of 220 nm, and selects a laser beam having a central wavelength of 1480 nm, to be emitted by the semiconductor laser device 20.

As best seen in FIG. 3, the p-InP spacer layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 8 and an n-InP blocking layer 9 formed as current blocking layers. In addition, a p-side electrode 10 is formed on the upper surface of InGaAsP cap layer 7, and an n-side electrode 11 is formed on the back surface of n-InP substrate 1.

As seen in FIG. 2, reflective film 14 having high reflectivity of, for example, 80% or more is formed on a light reflecting end surface that is one end surface in the longitudinal direction of the semiconductor laser device 20. Antireflection coating 15 having low reflectivity of, for example, not more than 2% and preferably not more than 1%, is formed on a light irradiating end surface opposing the light reflecting end surface of semiconductor laser device 20. In a preferred embodiment, the reflective coating 14 has a reflectivity of 97% and the antireflective coating 15 has a reflectivity of 0.1% The reflective film 14 and the antireflection coating 15 form a light resonator within the active region 3 of the semiconductor laser device 20. A light beam generated inside the GRIN-SCH-MQW active layer 3 of the light resonator is reflected by the reflective film 14 and irradiated as an output laser beam via the antireflection coating 15.

As also seen in FIG. 2, the resonator has a length L of 800 μm to 3200 μm as will be further described below. In the embodiment of FIG. 2, the diffracting grating 13 extends along only a portion of the length of the resonator and is placed so as to extend 100 μm from the antireflective coating 15. That is, the diffraction grating 13 is a partial grating positioned on the light emission side of the device 20. As used herein, the phrase "positioned on the light emission side" means that the distance from the antireflective film 15 to a grating element closest to the film 15 is smaller than the distance from the reflective film 14 to the grating element closest to the film 14. In this regard, the diffraction grating 13 is preferably placed so that the end grating element is in contact with the light emission side reflective film 15. However, the diffraction grating 13 may be positioned apart from the reflective film 15 as shown in FIG. 2. For example, the diffraction grating may be positioned within a range 0 μm to 30 μm from the film 15, or any other distance at which the diffraction grating 13 still performs its wavelength selection function and maintains an oscillation spectrum.

Figure 4:
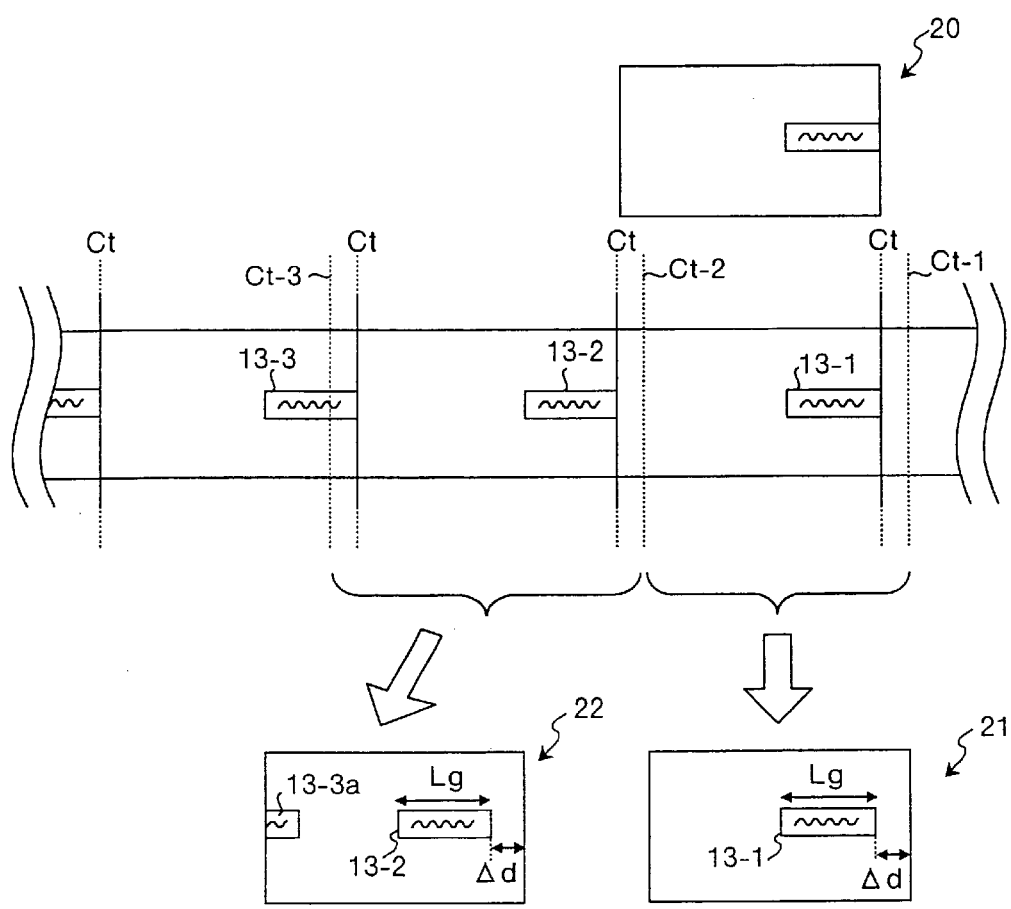
FIG. 4 shows deviations in the layout position of the diffraction grating due to deviations in a cleavage position of the semiconductor laser device in accordance with the present invention.

FIG. 4 shows deviations in the layout position of the diffraction grating 13 due to the deviations in a cleavage position of the semiconductor laser device 20. The cleavage is formed when a plurality of semiconductor laser devices formed in a matrix shape on a semiconductor substrate such as a wafer are cut into individual laser devices. As seen in FIG. 4, the wafer is first cut into strips, or laser bars, which form a series of semiconductor devices have their sides in the length direction aligned adjacent to each other. The cleavage occurs when the laser bar is cut into individual laser devices. When the cleavage is made at accurate cleavage positions Ct, diffraction gratings 13-1 to 13-3 of the respective semiconductor laser devices are allowed to contact the light emission side reflective film 15 as shown by semiconductor laser device 20 of FIG. 4. However, when the cleavage position is shifted toward the light emission side from the accurate cleavage position Ct, a resulting diffraction grating 13-1 has a distance Δd apart from the light emission side reflective film 15 as shown by device 21 in FIG. 4. Moreover, as shown by laser device 22, when the cleavage positions deviate to Ct-2, Ct-3, the resulting semiconductor device 22 has a diffraction grating 13-2 positioned a distance Δd apart from the light emission side reflective film 15, and also has a portion 13-3a of the diffraction grating 13-3 of the semiconductor device adjacent thereto on the reflective film 14 side of the laser device 22. However, even when the diffraction gratings 13-1, 13-2 are located apart from the light emission side reflective film 15, or when one portion thereof is left as the diffraction grating 13-3a on the reflective film 14 side, they are allowed to exert virtually the same functions as the semiconductor laser device 20 wherein an accurate cleavage Ct is made. That is, the devices 21, 22, and 23 exhibit substantially similar operational characteristics notwithstanding their different configurations.

Thus, as seen in the embodiment of FIGS. 1–3, the present invention provides a partial diffraction grating positioned on a light emission side of the semiconductor laser device 20. The present inventors have realized that such an integrated diffraction grating contained within the semiconductor laser device provides several advantages over external fiber grating laser modules such as the one described with respect to FIG. 27.

Figure 24:
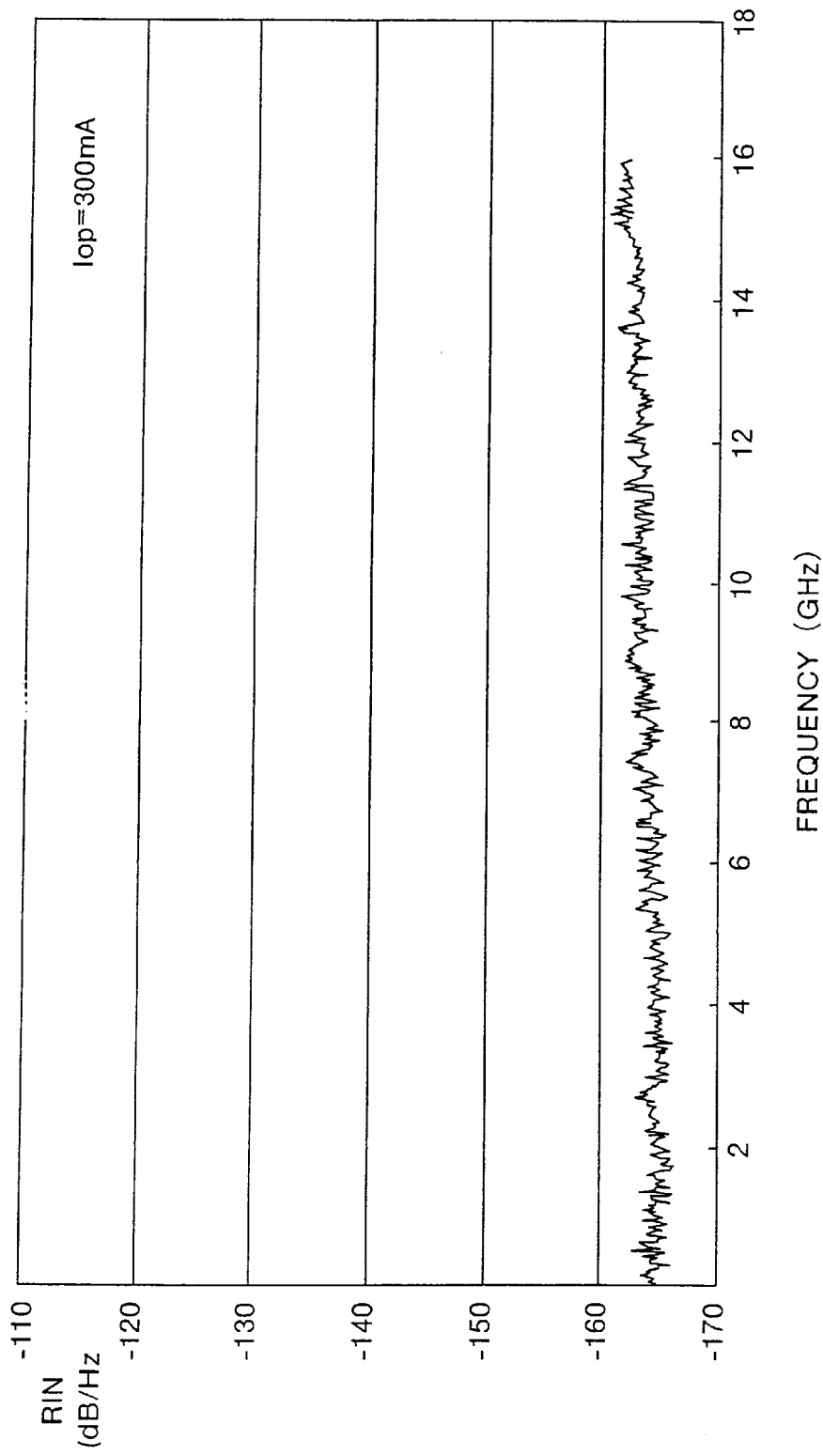
FIG. 24 is a noise spectrum diagram that shows the relative intensity noise achieved by a semiconductor laser device in accordance with the present invention.
Figure 25A:
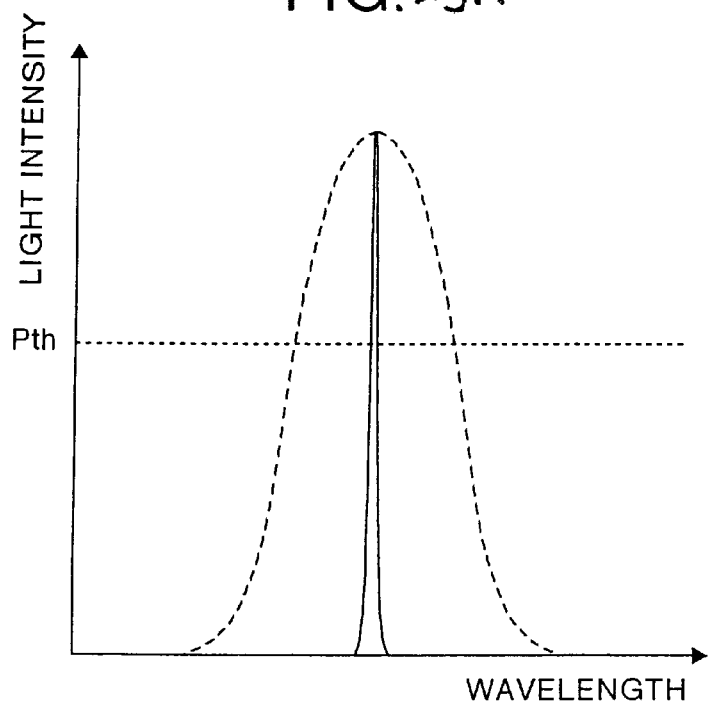
FIGS. 25A and 25B are graphs showing the relationship of laser beam output powers with respect to a single oscillation longitudinal mode and a plurality of oscillation longitudinal modes, and a threshold value of the stimulated Brillouin scattering.
Figure 25B:
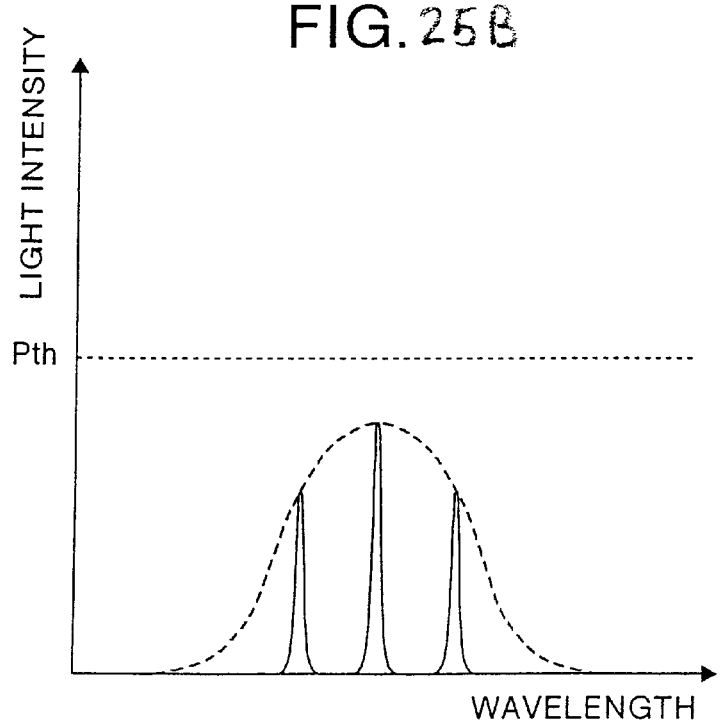
Figure 2B:
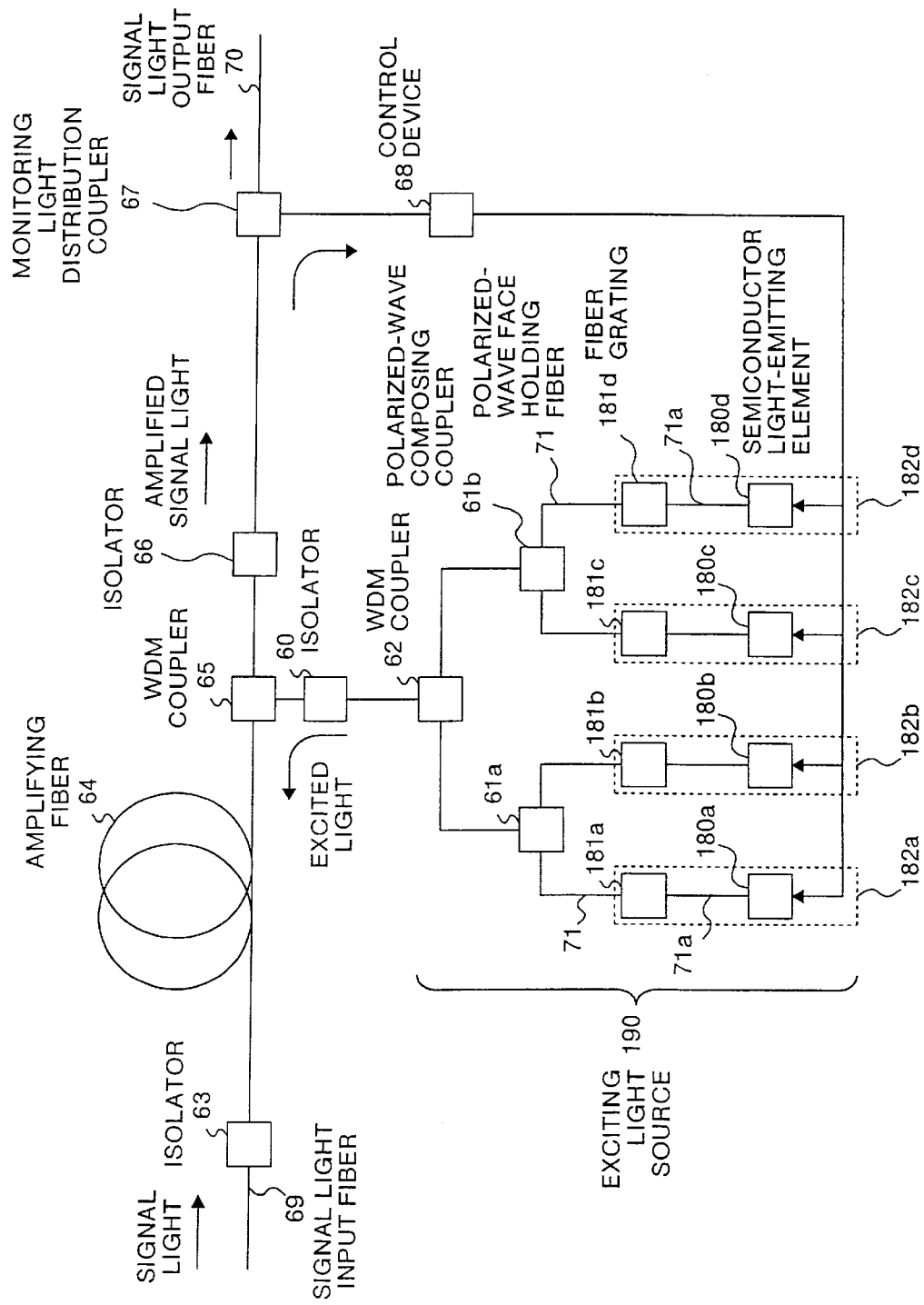
Figure 27:
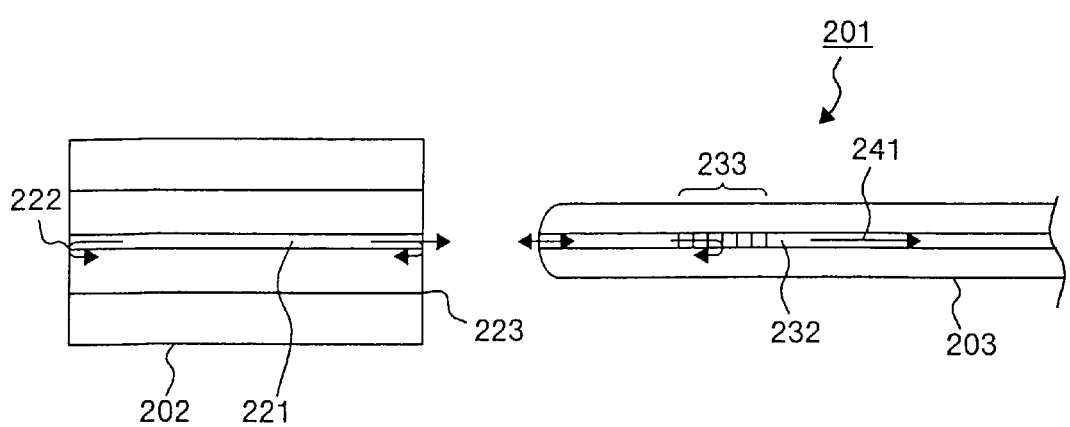
FIG. 27 is a diagram showing a configuration of a semiconductor laser module used in the Raman amplifier shown in FIG. 26.

First, the semiconductor laser module illustrated in FIG. 27 provides a light source with large RIN which is contrary to the requirements of a Raman amplifier as discussed above. Referring again to FIG. 27, the present inventors have discovered that the fiber grating semiconductor laser module 201 (182a through 182d in FIG. 26) has a large RIN due to resonance between the external fiber grating 233 and the light reflecting surface 222 of the semiconductor laser emitting element 202. That is, due to the long interval between the fiber grating 233 and the semiconductor light-emitting element 202, stable Raman amplification cannot be performed. However, since the semiconductor laser device 20 of the present invention provides a laser beam irradiated from the antireflection coating 15 directly as an excitation light source of the Raman amplifier without using an external fiber grating, the RIN is smaller. As a result, the fluctuation of the Raman gain becomes smaller and a stable Raman amplification can be performed in systems using an integrated diffraction grating semiconductor laser device in accordance with the present invention. A continuous wave of a pumping laser fluctuates because of a laser noise. FIG. 24 shows the RIN spectrum, measured at the frequency of 0.1 to 15 GHz, with a driving current of 300 mA. As illustrated in FIG. 24, the relative intensity noise is not more than −150 dB/Hz, thereby achieving a lower-noise Raman amplifier.

Moreover, because of the low RIN level, the integrated grating semiconductor laser device of the present invention is not constrained to a backward pumping method when used in a Raman amplification system as with fiber grating semiconductor laser modules. Applicants have recognized that the backward pumping method is most frequently used in present Raman amplifier systems because the forward pumping method, in which a weak signal light beam advances in the same direction as a strong excited light beam, has a problem in that fluctuation-associated noises of pumping light are easy to be modulated onto the signal. As discussed above, the semiconductor laser device of the present invention provides a stable pumping light source for Raman amplification and therefore can easily be adapted to a forward pumping method.

The mechanical stability problems of the semiconductor laser module illustrated in FIG. 27 are also diminished by the present invention. Since the resonator of the diffraction grating device is not physically separated from the semiconductor laser device but monolithically integrated therein, the semiconductor laser device of this first embodiment does not experience a variation of the oscillating characteristic of a laser caused by mechanical vibration or change in ambient temperature and can acquire a stable light output and Raman gain. Moreover, as the diffraction grating of the present invention is internal to the semiconductor device, the temperature of the grating is controlled by the temperature control unit that provides temperature control for the semiconductor device. This not only eliminates the affects of ambient temperature changes on the oscillation wavelength selected by the grating, but also provides a mechanism for controlling the oscillation wavelength of a multiple mode laser device in accordance with the present invention as will be further described below. While the integrated diffraction grating device of the present invention provides the above-described advantages over the fiber grating laser module, the primary use of the present invention is as a pumping source for a Raman amplifier. Therefore, the integrated diffraction grating device of the present invention must also provide multiple longitudinal mode operation. Despite the fact that conventional integrated grating devices provided only single mode operation suitable for a signal light source, the present inventors have discovered that multiple mode operation suitable for a pumping light source for Raman amplification can be provided by an integrated diffraction grating device.

Figure 5:
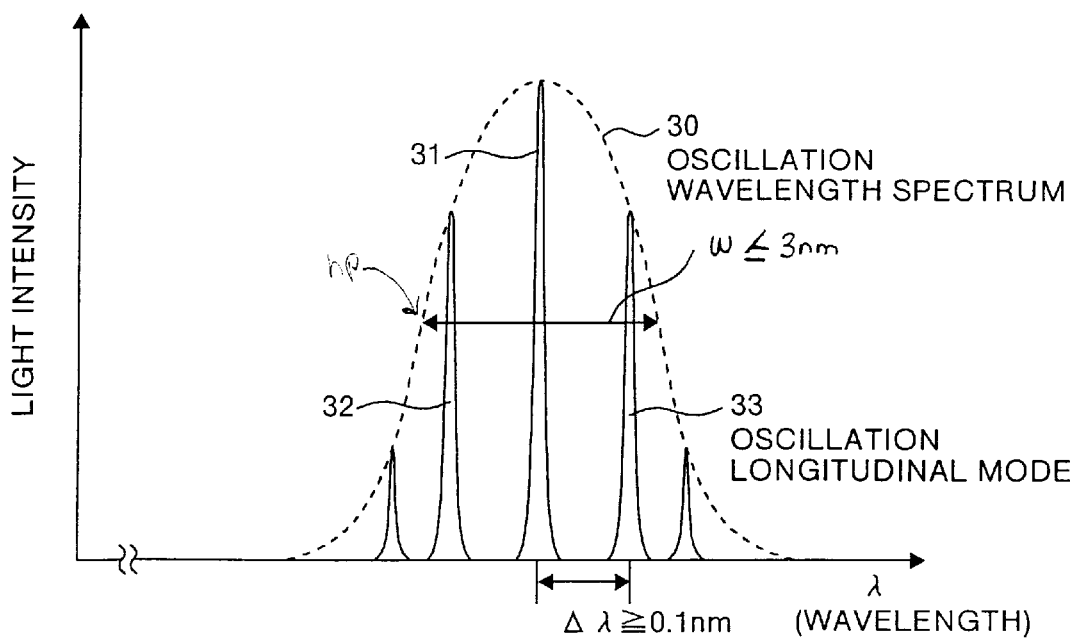
FIG. 5 is a graph showing the multiple oscillation longitudinal mode output characteristics of a diffraction grating semiconductor laser device in accordance with one embodiment of the present invention.

FIG. 5 shows the multiple oscillation longitudinal mode output characteristics of a diffraction grating semiconductor laser device of the present invention. As seen in this figure, the oscillation wavelength spectrum 30 provides multiple longitudinal modes, for example 31, 32, and 33, separated by a wavelength interval $\Delta\lambda$. As the integrated diffraction grating of the laser device of the present invention selects a longitudinal mode by its grating, FIG. 5 also shows the predetermined spectral width w of the oscillation spectrum 30 as defined by of half power points hp of the oscillation spectrum. The predetermined spectral width w is a predetermined spectral bandwidth, which defines a portion of the wavelength oscillation spectrum that includes the laser operating modes. Thus, while FIG. 5 shows the predetermined spectral width w as the full width at half maximum power (FWHM), it is to be understood that the predetermined spectral width w may be defined by any width on the oscillation spectrum 30. For example, another known way to define the predetermined spectral width is by the 10 db down from maximum power points of the oscillation wavelength spectrum 30. It is clear from this description that the number of laser operating modes may change for a given oscillation wavelength spectrum depending on how the predetermined spectral width w is defined. Thus, as recognized by the present inventors, in order to provide the multiple oscillation longitudinal mode characteristics required to reduce stimulated Brillouin scattering in a Raman amplifier, an integrated diffraction grating laser device of the present invention must provide a plurality of oscillation longitudinal modes within the predetermined spectral width w of the oscillation wavelength spectrum 30.

For example, FIG. 5A is a spectrum diagram of a laser device in accordance with the embodiment of FIGS. 1–3 of the present invention. Specifically, FIG. 5A shows the spectrum of a semiconductor laser device having a diffraction grating length Lg=100 μm, a resonator length L=1300 μm, and a product between the coupling coefficient κi of the diffraction grating of κi·Lg=0.11. The importance of the parameter κi·Lg in the present invention will be discussed below. In addition, the device producing the output of FIG. 5A had a reflectivity of the light emission side reflective film 15 is 0.1%, and a reflectivity of the reflective film 14 is 97%. As seen in FIG. 5A, under the conditions that the driving current Iop=700 mA, a light output of 210 mW with three oscillation longitudinal modes in the vicinity of 1480 nm was obtained having a half-width $\Delta\lambda$h of 0.5 to 0.6 nm. In this case, the half-width (FWHM: Full Width Half Maximum) of the far field pattern (FFP) was 16 to 18 degrees in the half-width in the horizontal direction, and 21 to 24 degrees in the half-width in the vertical direction. Thus, a stable laser light beam having three oscillation longitudinal modes is output by a laser device in accordance with the present invention.

Moreover, the present inventors have recognized that the number of longitudinal modes included in the predetermined spectral width w should be at least three, as shown by modes 31, 32, and 33 of FIG. 5 and the modes of FIG. 5A. As discussed above, Raman amplification systems using a forward pumping method presents a problem in the resulting gain is dependent on the polarization of the incident pumping light. This dependency is canceled by performing polarization-multiplexing of pumping light beams output from two of the semiconductor laser devices 20, or by depolarizing a pumping light beam output from a single semiconductor laser device using polarization maintaining fibers as a depolarizer (these alternative embodiments are shown in FIGS. 21 and 22 respectively which will be further described below). In the latter case, the angle of the polarization axis of the polarization maintaining fiber against the emitted light from semiconductor laser device is approximately 45 degrees. With this configuration, an output of the laser device having a single polarization can obtain a random polarization by propagating a minimum distance through a polarization maintaining fiber. In general, the more the number of the oscillation longitudinal modes is increased, the shorter the length of the polarization maintaining fiber can be. Particularly, when the number of the oscillation longitudinal modes is more than three, preferably four or five, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier, making it more feasible to replace 2 laser modules which are polarization-multiplexed with a single laser module with higher power and to thereby reduce the cost of lasers as well as polarization maintaining fibers.

In order to achieve the desired plurality of oscillation modes within the predetermined spectral width of the oscillation profile, the present inventors have recognized that the predetermined spectral width w and/or the wavelength interval $\Delta\lambda$ may be manipulated. However, a Raman amplification system poses limits on the values of the wavelength interval $\Delta\lambda$ and predetermined spectral width w of the oscillation wavelength spectrum 30. With regard to the wavelength interval $\Delta\lambda$, the present inventors have determined that this value should 0.1 nm or more as shown in FIG. 5. This is because, in a case in which the semiconductor laser device 20 is used as a pumping light source of the Raman amplifier, if the longitudinal mode interval $\Delta\lambda$ is 0.1 nm or less, it is likely that the stimulated Brillouin scattering is generated With regard to the predetermined spectral width w of the oscillation wavelength profile 30, if the predetermined spectral width of the oscillation wavelength is too wide, the coupling loss by a wavelength-multiplexing coupler becomes larger. Moreover, a noise and a gain variation are generated due to the fluctuation of the wavelength within the spectrum width of the oscillation wavelength. Therefore, the present inventors have determined that the predetermined spectral width w of the oscillation wavelength spectrum 30 should be 3 nm or less as shown in FIG. 4, and is preferably 2 nm or less.

In general, a wavelength interval $\Delta\lambda$ of the longitudinal modes generated by a resonator of a semiconductor device can be represented by the following equation:

$$\Delta\lambda = \lambda_0^2/(2 \cdot n \cdot L),$$

where n is the effective refractive index, $\lambda_0$ is the oscillation wavelength, and L is a length of the resonator defined by the reflection coating 14 and antireflection coating 15 as discussed with respect to FIGS. 1–3 above. From this equation it is seen that, neglecting refractive index n which has only a marginal affect on $\Delta\lambda$, the longer the resonator length is, the narrower the wavelength interval $\Delta\lambda$ becomes, and selection conditions for oscillating a laser beam of the single longitudinal mode becomes stricter. However, in order to provide the desired plurality of longitudinal modes within a predetermined spectral width w of 3 nm or less, the resonator length L cannot be made too short. For example, in the diffraction grating device of FIGS. 1–3 where the oscillation wavelength $\lambda_0$ is 1480 nm and the effective refractive index is 3.5, the wavelength interval $\Delta\lambda$ of the longitudinal mode is approximately 0.39 nm when the resonator length is 800 $\mu$m. When the resonator length is 800 $\mu$m or more, it is easy to obtain a plurality of operating modes and higher output power. However, the resonator length L must not be made so long that the required wavelength interval of 0.1 $\mu$m cannot be achieved. Returning to the example of FIGS. 1–3 when the resonator length is 3200 $\mu$m, the wavelength interval $\Delta\lambda$ of the longitudinal mode is approximately 0.1 nm.

Thus, for a semiconductor laser device having an oscillation wavelength $\lambda_0$ of 1100 nm to 1550 nm, and in particular 1480 nm, and an effective refractive index of 3.5, the resonator cavity length L must be approximately within the range of 800 to 3200 $\mu$m as indicated in FIG. 2. It is noted that an integrated diffraction grating semiconductor laser device having such a resonator length L was not used in the conventional semiconductor laser devices because single longitudinal mode oscillation is difficult when the resonator length L is 800 $\mu$m or more. However, the semiconductor laser device 20 of the present invention, is intentionally made to provide a laser output with a plurality of oscillation longitudinal modes included within the predetermined spectral width w of the oscillation wavelength spectrum by actively making the resonator length L 800 $\mu$m or more. In addition, a laser diode with such a long resonator length is suitable to get high output power.

The objective of providing a plurality of operating modes within a predetermined spectral width w of the oscillation profile 30 may also be achieved by widening the predetermined spectral width w of the oscillation profile 30. In general, the predetermined spectral width w of the oscillation wavelength spectrum 30 is varied by changing a coupling coefficient κi and/or a grating length Lg of the diffraction grating. Specifically, assuming a fixed coupling coefficient κi and a predetermined spectral width w defined by the FWHM points, where the grating length Lg of the resonator is decreased, the predetermined spectral width w is increased thereby allowing a greater number of longitudinal modes to occupy the predetermined spectral width w as laser operating modes. The conventional devices provided only single mode operation in which it was undesirable to increase predetermined spectral width. In this regard, it is noted that conventional integrated grating devices used only a full length grating structure. The present inventors have discovered that shortening the grating is useful in providing multiple mode operation.

Figure 6:
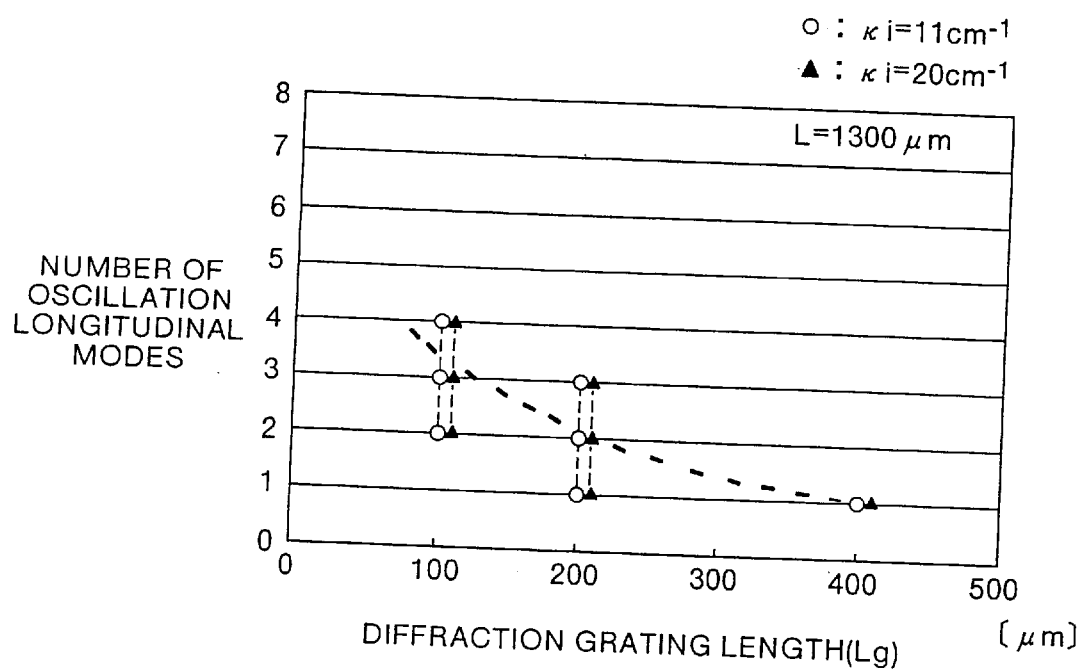
FIG. 6 is a graph showing the relationship between the diffraction grating length Lg and the number of the oscillation longitudinal modes for devices of the present invention having a different coupling coefficient.

As described above, a laser device to be used as an excitation source for a Raman amplifier should contain a plurality of oscillation longitudinal modes within a predetermined spectral width w of the laser device's wavelength oscillation profile. Methods and devices for providing a plurality of oscillation longitudinal modes within a predetermined spectral width are disclosed in U.S. patent application Ser. No. 09/832,885 filed on Apr. 12, 2001, the entire contents of which is incorporated herein by reference. The objective of providing multiple modes within a predetermined spectral width is generally achieved by adjusting the device cavity length to manipulate the wavelength interval and adjusting the coupling coefficient and/or grating length to manipulate the spectral width. Through careful study and experimentation, however, the present inventors discovered that where a shortened diffraction grating is placed on the antireflective coating side of the laser device as shown in FIGS. 1–3, the number of oscillation longitudinal modes with respect to the diffraction grating length Lg is independent of the coupling coefficient κi. More specifically, the present inventors produced several semiconductor laser devices each having a cavity length of 1300 μm and a partial diffraction grating placed on the antireflective coating side of the resonant cavity as shown in FIG. 2. The lengths and coupling coefficients of these devices were varied to determine the affect on multiple mode operation of the devices. FIG. 6 is a summary of the results of the experiment.

FIG. 6 is a graph showing the relationship between the diffraction grating length Lg and the number of the oscillation longitudinal modes for devices having a different coupling coefficient. As seen in FIG. 6, the number of oscillation modes was observed for diffraction grating lengths of 100 μm, 200 μm, and 400 μm. When the diffraction grating length Lg was 400 μm, the device oscillated with only one oscillation longitudinal mode. However, where the device had a grating length of 200 μm and 100 μm, the device oscillated in a multiple mode operation with two to four oscillation longitudinal modes. Thus, it is certain that when the diffraction grating length Lg is 100 μm or 200 μm, the oscillation is carried out with two or more oscillation modes. Moreover, the trend of FIG. 6 shows that when the diffraction grating length Lg is not more than 300 μm, the number of oscillation longitudinal modes is not less than two.

As also seen in FIG. 6, the diffraction grating devices were tested at a diffraction grating coupling coefficient value of κi=11 cm$^{-1}$ and 20=cm$^{-1}$. Significantly, the number of oscillation longitudinal modes with respect to the diffraction grating length Lg was found to be independent of the coupling coefficient κi for devices having a partial diffraction grating on the antireflective coating side of the resonator. Therefore, the present inventors discovered, for devices such as that shown in FIGS. 1–3, that it is possible to obtain a plurality of oscillation longitudinal modes by simply setting the diffraction grating length Lg to 300 μm or less, more preferably 200 μm or less, and most preferably 100 μm or less, under the condition that the resonator length L is 1300 μm.

However, the present inventors also recognized that since the interval of the oscillation longitudinal modes varies in proportion to the length of the resonator L, the diffraction grating length Lg should have a value that is in proportion to the resonator length L. In other words, for devices having a resonator length different than the device tested in FIG. 6, the relationship of the diffraction grating length to resonator length of 300:1300 should be maintained. Therefore, the relationship in which a plurality of oscillation longitudinal modes are obtained is extended based upon the following inequality:

$$Lg \times (1300 \, \mu m)/L) \leq 300 \, \mu m,$$

where Lg and L are in μm. Using this formula, a device according to the present invention having a diffraction grating on the light emission side of the resonant cavity can achieve multiple mode operation as long as the relationship between the cavity length and the grating length satisfies the inequality.

While coupling coefficient κi has no impact on the number of oscillation modes when the diffraction grating is used on the antireflective side of the device 20, the present inventors have discovered that the relationship between κi and Lg in these devices has great importance in providing the wide dynamic range required for Raman amplification of a WDM system. As discussed in the Background of the Invention section above, it is desirable for the pump laser to have low noise and wide dynamic range when used in a WDM system. The present inventors have recognized that such a wide dynamic range requires a monotonic relationship between the input current and the output light of the semiconductor laser device. That is, the device must have a monotonically increasing (kink free) I-L characteristic. In recognizing this, the present inventors conducted various experiments wherein physical parameters of the laser device were changed while observing the I-L characteristics of the device.

Figure 7:
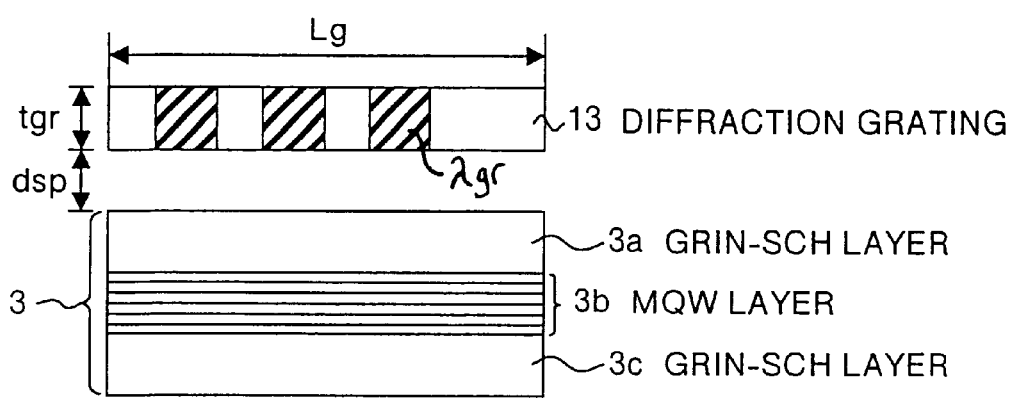
FIG. 7 is a diagram showing various physical parameters of a semiconductor laser device according to the present invention.

FIG. 7 shows various physical parameters of a semiconductor laser device according to the present invention. The figure shows a layout relationship between the GRIN-SCH-MQW active layer 3 and the diffraction grating 13, with the GRIN-SCH-MQW active layer 3 having a construction in which the MQW layer 3b is sandwiched by the GRIN-SCH layers 3a and 3c. As seen in FIG. 7, the length of the diffraction grating 13 is represented by "Lg" (μm), the thickness of the diffraction grating is represented by "tgr" (nm), and the distance between the diffraction grating 13 and the GRIN-SCH layer 3a is represented by "dsp" (nm). In addition, "λgr" (μm) represents the bandgap wavelength of diffraction grating, which corresponds to the band gap energy of a material forming the diffraction grating 13 so as to be lattice matched with the n-InP substrate 1. The present inventors examined the I-L characteristics of a laser device under various conditions of the physical parameters shown in FIG. 7. FIG. 8 is a table that summarizes the tests conducted and the results of such tests. For example, as seen in the first entry of FIG. 8, under the dsp=200 nm, tgr=20 nm, and λgr=1.1 μm, the diffraction grating length Lgr was varied to respective values of 30 μm, 60 μm, 100 μm, 200 μm and 400 μm and the I-L characteristics were observed. Similarly, the second and third entries of FIG. 8 show other values dsp, tgr, and λgr tested at the diffraction grating lengths Lgr of 30 μm, 60 μm, 100 μm, 200 μm and 400 μm.

As also seen in FIG. 8, the various combinations of physical properties of the device in relation to grating length provided different I-L characteristics. What is remarkable is that the coupling coefficient κi is represented by a function between the change in the diffractive index of the diffraction grating 13 and an optical confinement factor Γg of the diffraction grating layer. Moreover, the optical confinement factor Γg is represented by a function having the parameters dsp, tgr, and λgr. Thus, the coupling coefficient κi is a value that is dependent on the thickness between the diffraction grating and the GRIN-SCH layer (dsp), the thickness of the diffraction grating (tgr), and the bandgap wavelength of diffraction grating (λgr).

As seen in FIG. 8, superior I-L characteristics were obtained when the diffraction grating length Lg was 60 μm or 100 μm and the physical parameters of the device were set for a coupling coefficient of κi=11 cm$^{-1}$. In addition, superior I-L characteristics were obtained when the diffraction grating length Lg was 30 μm or 60 μm in the case of the coupling coefficient κi=20 cm$^{-1}$. Only "comparatively superior" I-L characteristics were obtained when the diffraction grating length Lg was 200 μm with a coupling coefficient of κi=11 cm$^{-1}$, and when the diffraction grating length Lg was 100 μm with a coupling coefficient κi=20 cm$^{-1}$. In all other cases of FIG. 8, the inferior I-L characteristics were observed. Applicants have determined that the reasons for the difference in I-L characteristics of these devices is attributable to "kinks" in the I-L curves of the devices.

Figure 9:
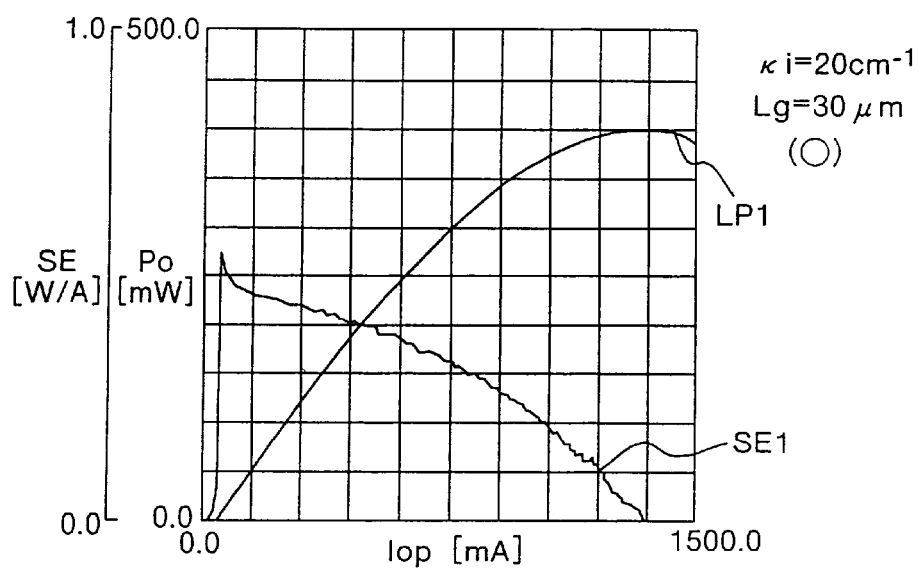
FIGS. 9–11 are graphs showing the I-L curves of devices having different I-L characteristics in accordance with the present invention.
Figure 10:
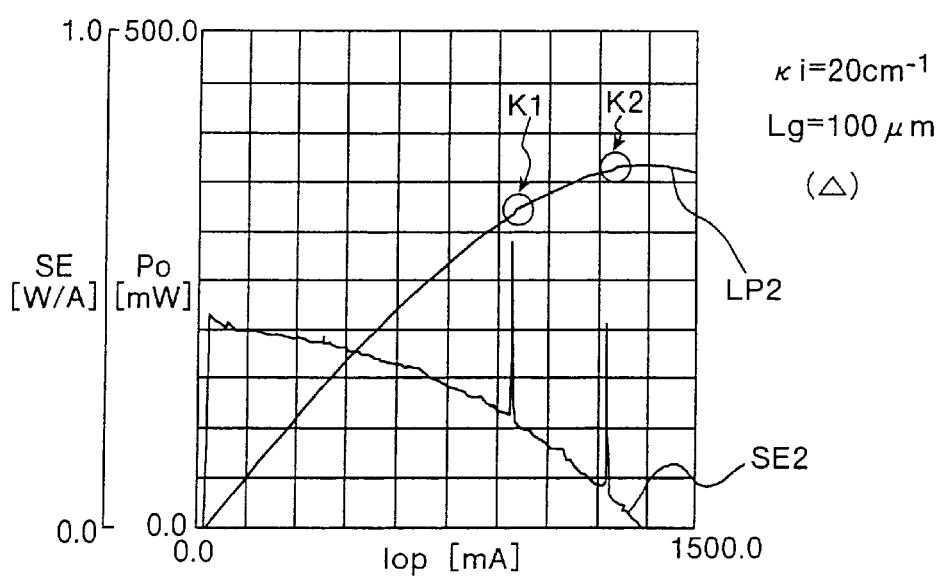
Figure 11:
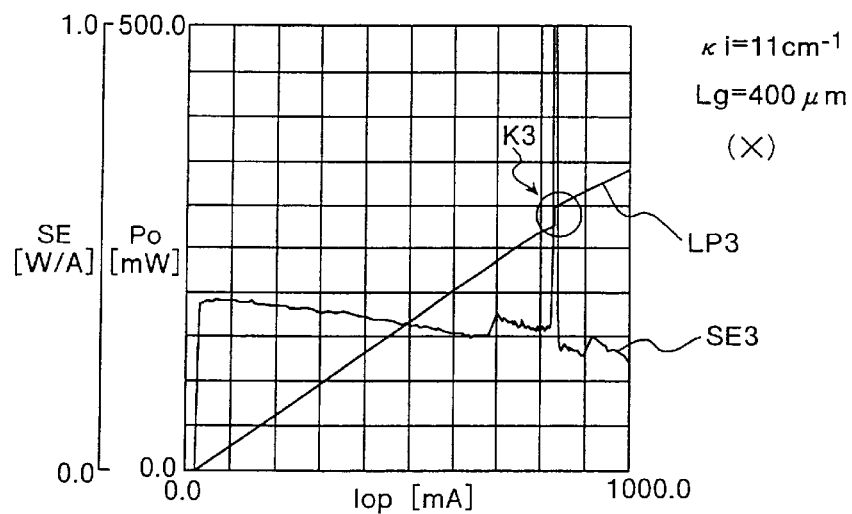

FIGS. 9–11 are graphs showing the I-L curves of devices having "superior", "comparatively superior" and "inferior" I-L characteristics as indicated in the table of FIG. 8. FIG. 9 shows I-L characteristics of a device having a coupling coefficient of κi=20 cm$^{-1}$ and a diffraction grating length Lg of 30 μm. As discussed with respect to FIG. 8, this device was observed to have superior I-L characteristics. Thus, the curve "LP1" of the device in FIG. 9 shows a monotonically increasing I-L curve that is kink free. This kink free curve is further demonstrated by the curve "SE1" of FIG. 9 which results from the first-order differential operation carried out on the I-L curves LP1. In the superior I-L characteristics shown in FIG. 9, large kinks do not occur from several tens mA to 1500 mA, and the driving current Iop achieves a high output of approximately 400 mW with high efficiency in the vicinity of 1200 mA.

Similarly, FIG. 10 shows the I-L characteristics of a laser device having comparatively superior I-L characteristics as shown in FIG. 8. Specifically, "LP2" curve of FIG. 10 shows the I-L curve of a device having a coupling coefficient of κi=20 cm$^{-1}$ and a diffraction grating length Lg of 100 μm. As seen in FIG. 10, the I-L characteristics are somewhat monotonically increasing with small kinks "K1" and "K2" occurring in the vicinity of 900 mA and 1200 mA in the driving current Iop. These kinks are clearly evident in the differential curve "SE2" and cause a shift of the oscillation waveform which results in an unstable oscillating operation. However, this waveform instability can be eliminated by carrying out a waveform stabilizing control, such as a temperature controlling operation, which eliminates the kinks K1, K2 from the I-L curve LP2, thereby providing superior I-L characteristics. Thus, device of FIG. 10 is said to have a "comparatively superior" I-L characteristic.

Finally, FIG. 11 shows I-L characteristics for an inferior device of FIG. 8 having a coupling coefficient of κi=11 cm$^{-1}$ and a diffraction grating length Lg of 400 μm. In the inferior I-L characteristics shown in FIG. 11, a great kink K3 occurs in the vicinity of 900 mA in the driving current, resulting in a very unstable oscillating operation which cannot be corrected by temperature control.

Based on the results shown in FIGS. 8–11, the present inventors determined that the product between the coupling coefficient κi and the diffraction grating Lg may be used for evaluating the I-L characteristics. Specifically, as seen in the parentheticals of FIG. 8, the four devices exhibiting superior I-L characteristics had a κi·Lg of 0.06 (two instances), 0.1 and 0.12 respectively. When the product κi·Lg was 0.2, the I-L characteristics were only comparatively superior thereby requiring temperature control for the device as described above. And when the product κi·Lg was 0.4 or more, the I-L characteristics are inferior. Thus, when a laser device has a product κi·Lg of approximately 0.3 or less, superior I-L characteristics are obtained and the device will provide a low noise characteristics and a wide dynamic range. However, as also noted in FIG. 8, when the product κi·Lg is as small as 0.03, it is not possible to carry out a sufficient pulling, resulting in degradation in the waveform selectivity and the subsequent failure in practical application of the device.

Figure 12:
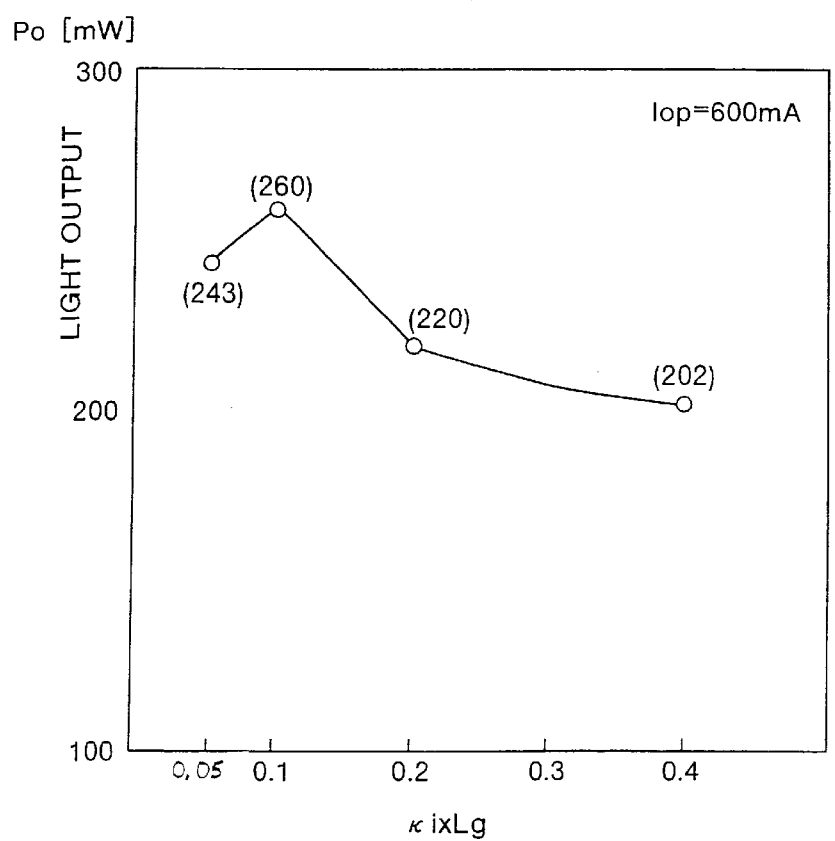
FIG. 12 is a graph showing the relationship between the product κi·Lg and the light output of the four semiconductor laser devices having superior I-L characteristics in accordance with the present invention.

In addition to determining the I-L relationship of a device, the present inventors have also discovered that the product κi·Lg also determines the output power of a laser device. FIG. 12 shows the relationship between the product κi·Lg and the light output of the four semiconductor laser devices of FIG. 8 having superior I-L characteristics. Specifically, each plot in FIG. 12 represents the relationship between the product κi·Lg and the light output of the device when a driving current Iop of 600 mA is applied. As seen in the figure, when the product κi·Lg is 0.1, the light output reaches a maximum value 260 mW, and when the product κi·Lg is 0.05, the light output 243 mW. Moreover, as the product κi·Lg increases beyond 0.1, the light output tends to decrease successively as the product κi·Lg increases. From this data, it is clear that it is most preferable for a laser device to have a product κi·Lg of 0.1 in order to provide a stable oscillation and high output power operation.

Thus, the κi·Lg is an important factor in providing improved I-L characteristics of a device and high output power. It is noteworthy that the length of the diffraction grating Lg, as well as the thickness between the diffraction grating and the GRIN-SCH layer (dsp), the thickness of the diffraction grating (tgr), and the bandgap wavelength of diffraction grating (λgr), which determine the coupling coefficient κi, are all controllable physical parameters of the laser device. Therefore, the product κi·Lg may be set by controlling these physical parameters during the manufacture of the semiconductor laser device. FIG. 13 is a table indicating the physical characteristics of various laser devices that provide a desirable κi·Lg of 0.1 or 0.05 according to the present invention. For example, as seen in this figure, setting the thickness between the diffraction grating and the GRIN-SCH layer (dsp) to 50 nm, the thickness of the diffraction grating (tgr) to 30 nm, and the bandgap wavelength of diffraction grating (λgr) to 1.1 μm will achieve a coupling coefficient of κi=24.4 cm$^{-1}$. Then, setting the diffraction grating length Lg to 40 (μm), the product κi·Lg of 0.0976 is achieved, which is approximately equal to the desired product of 0.10.

In accordance with the first embodiment, the diffraction grating 13 is placed in the vicinity of the GRIN-SCH-MQW active layer 3 on the light emission reflective film 15 side, and when the oscillation wavelength is set in the range of 1100 to 1550 nm with the resonator length L being set to 1300 μm, it is possible to obtain a plurality of oscillation longitudinal modes within the oscillation waveform spectrum by setting the diffraction grating length Lg to not more than 300 μm. Thus, when this is applied to an excitation light source for the Raman amplifier, it becomes possible to obtain a stable, high Raman gain without generating stimulated Brillouin scattering.

Moreover, by setting the product between the coupling coefficient κi and the diffraction grating length Lg, κi·Lg, to not more than 0.3, preferably not more than 0.2, more preferably, not more than 0.1, it becomes possible to obtain I-L characteristics that are less susceptible to large kinks and have a great dynamic range, and consequently to provide a semiconductor laser device capable of a high output operation with high efficiency.

In addition, not limited to a semiconductor laser device in which a diffraction grating is formed along the active layer, the present embodiment is of course applied to a semiconductor laser device having an optical guide path adjacent to the active layer.

In each of the embodiments previously described, the diffraction grating has a constant grating period. In yet another embodiment of the present invention, the predetermined spectral width w of the oscillation profile 30 is manipulated by varying the pitch of the diffraction grating. Specifically, the present inventors have realized that the wavelength oscillation profile 30 is shifted toward a longer wavelength where the width of the grating elements (i.e. the grating pitch) is increased. Similarly, the wavelength oscillation profile 30 is shifted toward a shorter wavelength where the grating pitch is decreased. Based on this realization, the present inventors have discovered that a chirped diffraction grating, wherein the grating period of the diffraction grating 13 is periodically changed, provides at least two oscillation profiles by the same laser device. These two oscillation profiles combine to provide a composite profile having a relatively wide predetermined spectral width w thereby effectively increasing the number of longitudinal modes within the predetermined spectral width w.

Figure 14:
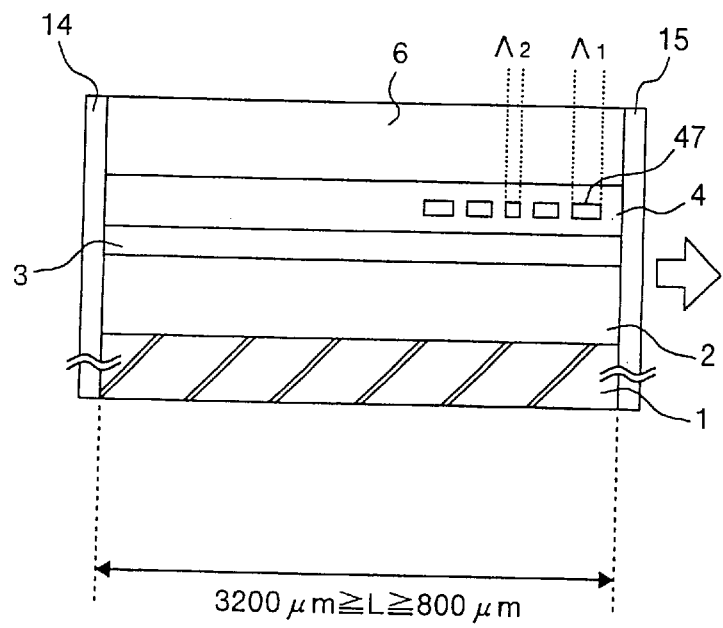
FIG. 14 is a vertical sectional view in the longitudinal direction illustrating a general configuration of a semiconductor laser device having a chirped diffraction grating in accordance with an embodiment of the present invention.
Figure 15:
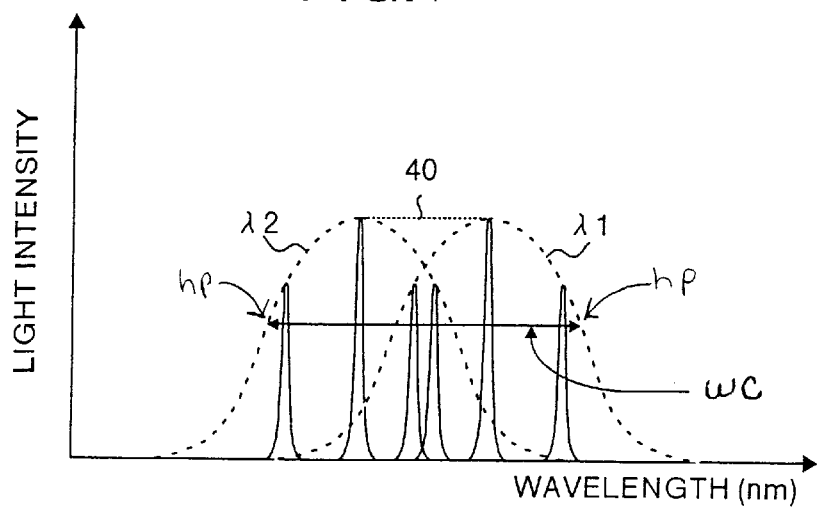
FIG. 15 is a graph illustrating the principle of a composite oscillation wavelength spectrum produced by the combined period $\Lambda_1$ and $\Lambda_2$ of FIG. 8.

FIG. 14 is a vertical sectional view in the longitudinal direction illustrating a general configuration of a semiconductor laser device having a chirped diffraction grating. As seen in this figure, diffraction grating 47 is positioned on the light emission side of the laser device and is made to include at least two grating periods $\Lambda_1$ and $\Lambda_2$. FIG. 15 is a graph illustrating the principle of a composite oscillation wavelength spectrum produced by the combined period $\Lambda_1$ and $\Lambda_2$ of FIG. 14. As seen in FIG. 15, an oscillation wavelength spectrum corresponding to $\Lambda_1$ is produced at a longer wavelength than the oscillation wavelength spectrum corresponding to $\Lambda_2$ since the pitch $\Lambda_1$ is larger than $\Lambda_2$. Where these individual oscillation wavelength spectrums are made to overlap such that a short wavelength half power point of the spectrum of $\Lambda_1$ is at a shorter wavelength than a long wavelength half power point of the spectrum of $\Lambda_2$, a composite oscillation wavelength spectrum 40 is formed as shown in FIG. 15. This composite spectrum 40 defines a composite spectrum width to thereby effectively widen the predetermined spectral width of wavelength oscillation spectrum to include a larger number of oscillation longitudinal modes.

Figure 16:
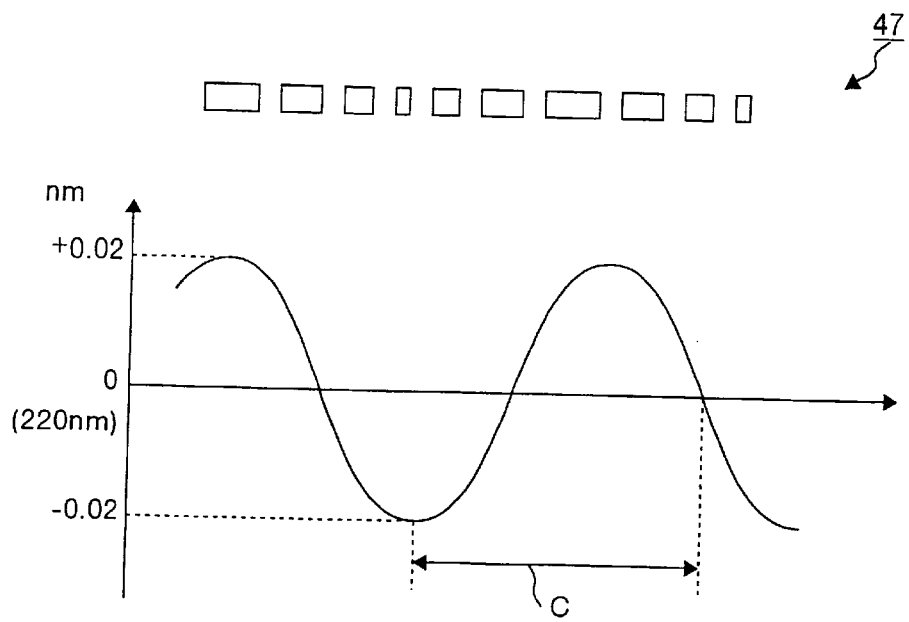
FIG. 16 illustrates a periodic fluctuation of the grating period of a chirped diffraction grating in accordance with the present invention.

FIG. 16 illustrates a periodic fluctuation of the grating period of the diffraction grating 47. As shown in FIG. 16, the diffraction grating 47 has a structure in which the average period is 220 nm and the periodic fluctuation (deviation) of ±0.02 nm is repeated in the period C. In this example, the reflection band of the diffraction grating 47 has the half-width of approximately 2 nm by this periodic fluctuation of ±0.02 nm, thereby enabling three to six oscillation longitudinal modes to be included within the composite width wc of the composite oscillation wavelength spectrum.

Figure 17A:
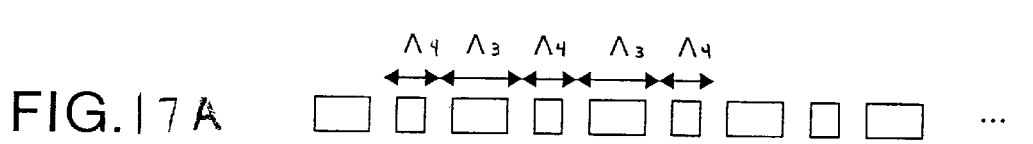
FIGS. 17A through 17C illustrate examples for realizing the periodic fluctuation of the diffraction grating in accordance with the present invention.
Figure 17B:
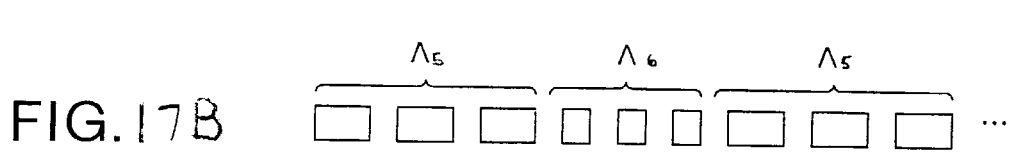
Figure 17C:
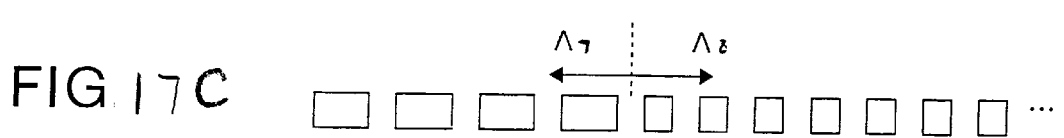

Although the chirped grating is the one in which the grating period is changed in the fixed period C in the above-mentioned embodiment, configuration of the present invention is not limited to this, and the grating period may be randomly changed between a period $\Lambda_1$ (220 nm+0.02 nm) and a period $\Lambda_2$ (220 nm−0.02 nm). Moreover, as shown in FIG. 17A, the diffraction grating may be made to repeat the period $\Lambda_3$ and the period $\Lambda_4$ alternately and may be given fluctuation. In addition, as shown in FIG. 17B, the diffraction grating may be made to alternatively repeat the period $\Lambda_5$ and the period $\Lambda_6$ for a plurality of times respectively and may be given fluctuation. And as shown in FIG. 17C, the diffraction grating may be made to have a plurality of successive periods $\Lambda_7$ and a plurality of successive periods $\Lambda_7$ and may be given fluctuation. Further, the diffraction grating may be disposed by supplementing a period having a discrete different value between the period $\Lambda_7$ and the period $\Lambda_8$.

Figure 18:
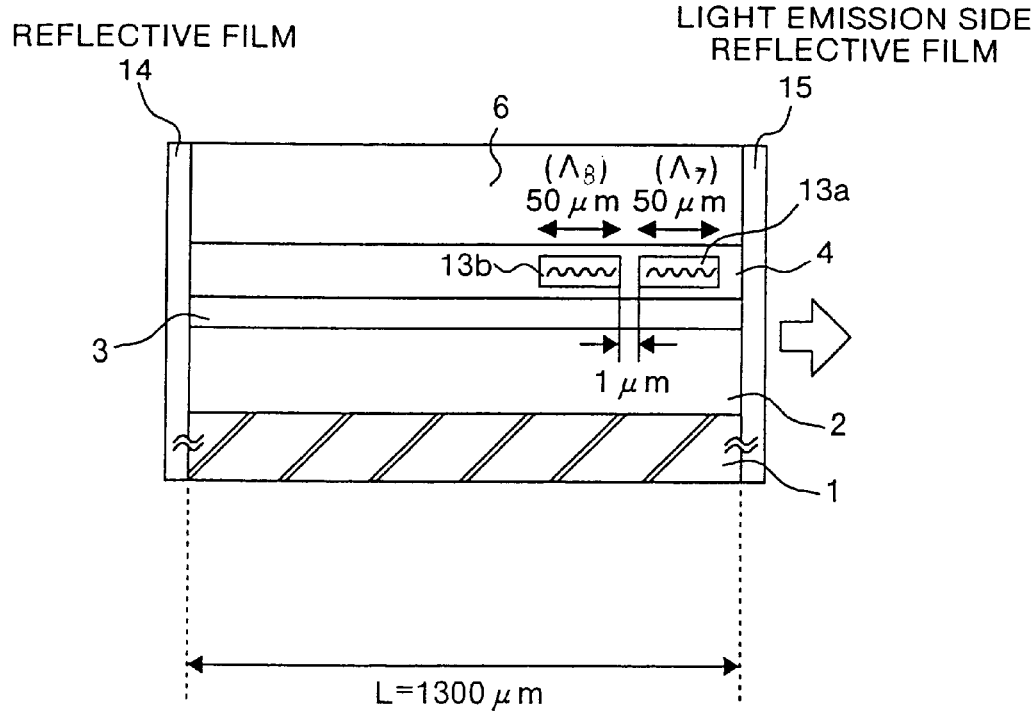
FIG. 18 is a longitudinal cross-sectional view that shows a semiconductor laser device of the present invention having a grating construction as shown in FIG. 17C.

FIG. 18 is a longitudinal cross-sectional view that shows a semiconductor laser device having a grating construction as shown in FIG. 17C. As seen in FIG. 18, the semiconductor laser device includes two diffraction gratings 13a, 13b, which substitute the diffraction grating 13 of the embodiment shown in FIGS. 1–3. The resonator length L of the device in FIG. 18 is 1300 μm, and the other arrangements are the same as those of FIGS. 1–3 with the same components indicated by the same reference numbers. The diffraction grating 13a has a length of 50 μm along the active layer 3 with waveform selectivity of the wavelength λ1, and the diffraction grating 13b has a length of 50 μm along the active layer 3 with waveform selectivity of the wavelength λ2.

As seen in FIG. 18, the diffraction grating 13a is placed in the vicinity of the light emission side reflective film 15, with diffraction grating 13b placed a distance of 1 μm from the grating 13a toward the reflective film 14. In the figure, $\Lambda_7$ represents the pitch of the elements of diffraction grating 13a for selecting the wavelength λ1 and the $\Lambda_8$ is the pitch of the diffraction grating 13b for selecting the wavelength λ2. The pitches $\Lambda_7$ and $\Lambda_8$ are values corresponding to a wavelength in the vicinity of 1480 nm and have a relationship represented by the following equation:

$$\Lambda_1 = \Lambda_2 + 0.2 \text{(nm)}.$$

Additionally, the end grating element of the diffraction grating 13a is preferably in contact with the light emission side reflective film 15, although the grating 13a may be 20 μm to 100 μm away from the light emission side reflective film 15 as discussed with respect to FIG. 4 above.

As noted above, the structure of FIG. 18 provides a composite oscillation wavelength spectrum that is relatively wide in comparison to a single pitch diffraction grating device. Therefore more oscillation longitudinal modes are easily selected and output by a device constructed in accordance with FIG. 18 thereby making it possible to increase the light output. Moreover, the grating construction of FIG. 18 can provide improvements in I-L characteristics. FIG. 19 is a table that shows the results of measurements on the I-L characteristics of a device having the diffraction gratings 13a, 13b as shown in FIG. 18. As seen in this table, a device having a single diffraction grating of 100 μm as shown in FIGS. 1–3 and a device having two 50 μm diffraction gratings as shown in FIG. 18 were each tested at various values of dsp, tgr and λgr. When the product between the coupling coefficient κi and the diffraction grating length Lg was set to κi·Lg=0.2 for the two 50 μm grating device, the number of the oscillation longitudinal modes was four and the I-L characteristics were observed to be superior. This showed an improvement over the "comparatively superior" I-L characteristics obtained with a single pitch diffraction grating device having a grating length of Lg=100 μm. Therefore, the application of the diffraction gratings 13a, 13b made the I-L characteristics superior, thereby making it more possible to provide a stable oscillation operation with high efficiency that is free from kinks.

It is noted that the dsp tgr, and λgr values shown in FIG. 19 apply to both gratings in the two 50 μm grating device. However, it is to be understood that these values may be the same or different for each 50 μm grating device as long as the desired coupling coefficient κi is achieved.

Thus, as illustrated by FIGS. 14–19, by giving the diffraction grating provided in the semiconductor laser device a periodic fluctuation of plus or minus a few nm with respect to an average period through the chirped grating, the predetermined spectral width of a composite oscillation wavelength spectrum wc can be set to a desired value. Therefore, an output laser beam with a plurality of oscillation longitudinal modes within the predetermined spectral width can be provided by a semiconductor laser device of this embodiment.

FIG. 20 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

Figure 20A:
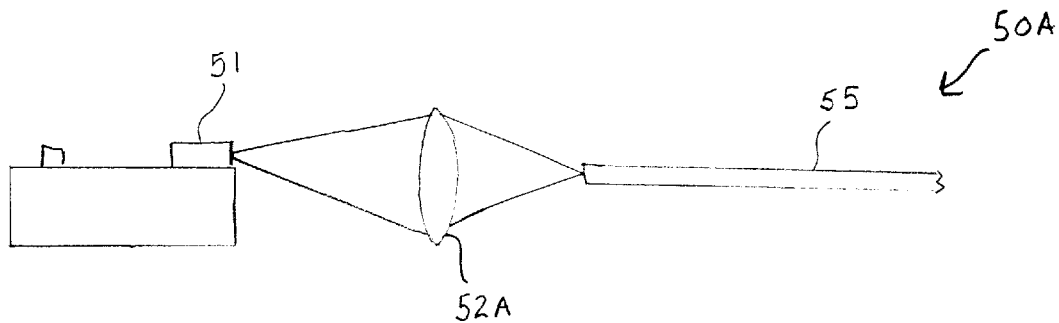
FIGS. 20A through 20C illustrate different embodiments of a semiconductor laser module in accordance with the present invention.
Figure 20B:
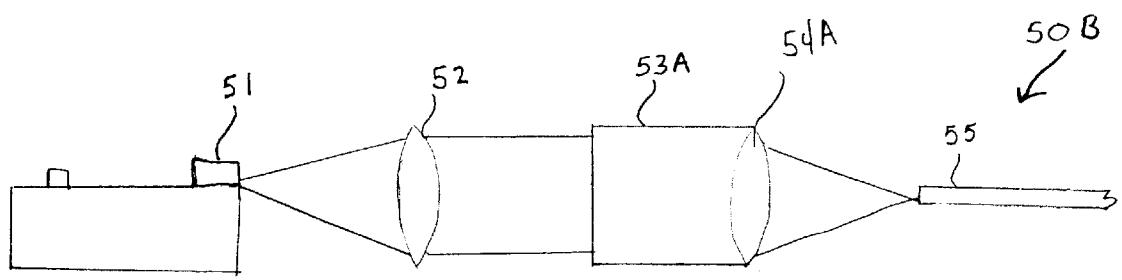
Figure 20C:
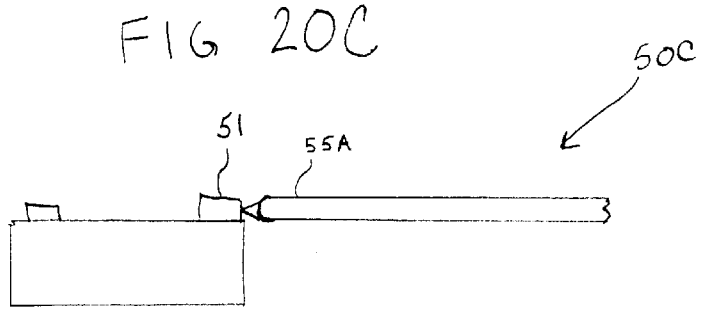

The semiconductor laser device according to the present invention may also be used to provide semiconductor laser modules of different configurations. FIGS. 20A through 20C illustrate different embodiments of a semiconductor laser module in accordance with the present invention. As seen in FIG. 20A, a semiconductor laser module 50A may include the laser device 51 providing a light beam to the single lens 52A, which focuses the light beam directly to the input of the optical fiber 55. In FIG. 20B, a laser module 50B includes the laser device 51 providing light to a lens 52 similar to the laser module 50 of FIG. 20. However, in the module 50B, an isolator 53A includes an integrated second lens 54A that focuses the light beam to the input of the optical fiber 55. Still alternatively, a semiconductor laser device module may be configured such that the laser device 51 provides a light beam directly to a lensed optical fiber 55A as shown by the module 50C of FIG. 20C. Moreover, it is to be understood that these semiconductor laser modules are exemplary only; a laser module of the present invention includes the laser device 51 having the characteristics described above, and may be configured in a variety of different ways as is understood by one of ordinary skill in the art. The present inventors have recognized that, in the semiconductor laser module 50 having the semiconductor laser device 51 of the present invention, since the diffraction grating is formed inside the semiconductor laser device 51, internal isolator 53 can be intervened between the semiconductor laser device 51 and the optical fiber 55. This provides an advantage in that reflected return light beams by other optical parts or from the external of the semiconductor laser module 50 are not re-inputted in the resonator of the laser device 51. Thus, the oscillation of the semiconductor laser device 51 can be stable even in the presence of reflection from outside. Moreover, placing the internal isolator 53 between the laser device 51 and optical fiber 55 does not introduce loss to the laser module. As is known in the art, the loss of an isolator is primarily in the area of a collecting lens which focuses the light beam onto a fiber at the output of the isolator material. The loss is caused by the coupling between this output lens and an output optical fiber. However, by using an internal isolator 53, the second lens 54 of the laser module 50 provides the function of the output lens of the isolator. Since the second lens 54 is necessary to the laser module 50 even without the internal isolator, the internal isolator 53 does not introduce any power loss into the laser module 50. In fact, use of the internal isolator reduces the loss of Raman amplifier system as will be further described below. Another advantage provided by the Internal polarization independent isolator 53 is that it provides stable isolation characteristics. More specifically, since internal isolator 53 is in contact with the Peltier module 58, the internal isolator 53 is held at a constant temperature and therefore does not have the fluctuating isolation characteristics of an external isolator which is typically at ambient temperature.

A back face monitor photo diode 56 is disposed on a base 57 which functions as a heat sink and is attached to a temperature control device 58 mounted on the metal package 59 of the laser module 50. The back face monitor photo diode 56 detects a light leakage from the reflection coating side of the semiconductor laser device 51. The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Yet another advantage of the laser module 50 using the integrated laser device according to the present invention 15 that the Peltier module can be used to control the oscillation wavelength of the laser device. As described above, the wavelength selection characteristic of a diffraction grating is dependant on temperature, with the diffraction grating integrated in the semiconductor laser device in accordance with the present invention, the Peltier module 58 can be used to actively control the temperature of the grating and, therefore, the oscillation wavelength of the laser device.

FIG. 21 is a block diagram illustrating a configuration of a Raman amplifier used in a WDM communication system in accordance with the present invention. In FIG. 21, semiconductor laser modules 60a through 60d are of the type described in the embodiment of FIG. 20. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Thus, as seen in FIG. 21, a Raman amplifier using a laser module in accordance with the present invention does not include an external isolator such as isolator 60 of FIG. 26. Therefore, the loss associated with the external isolator, as discussed above, is eliminated from the Raman amplifier system of FIG. 21. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor light-emitting elements 180a through 180d based on the portion of the amplified signal light beams input to the control circuit 68. Moreover, control circuit 68 performs feedback control of a gain band of the Raman amplification such that the gain band will be flat over wavelength.

Figure 21A:
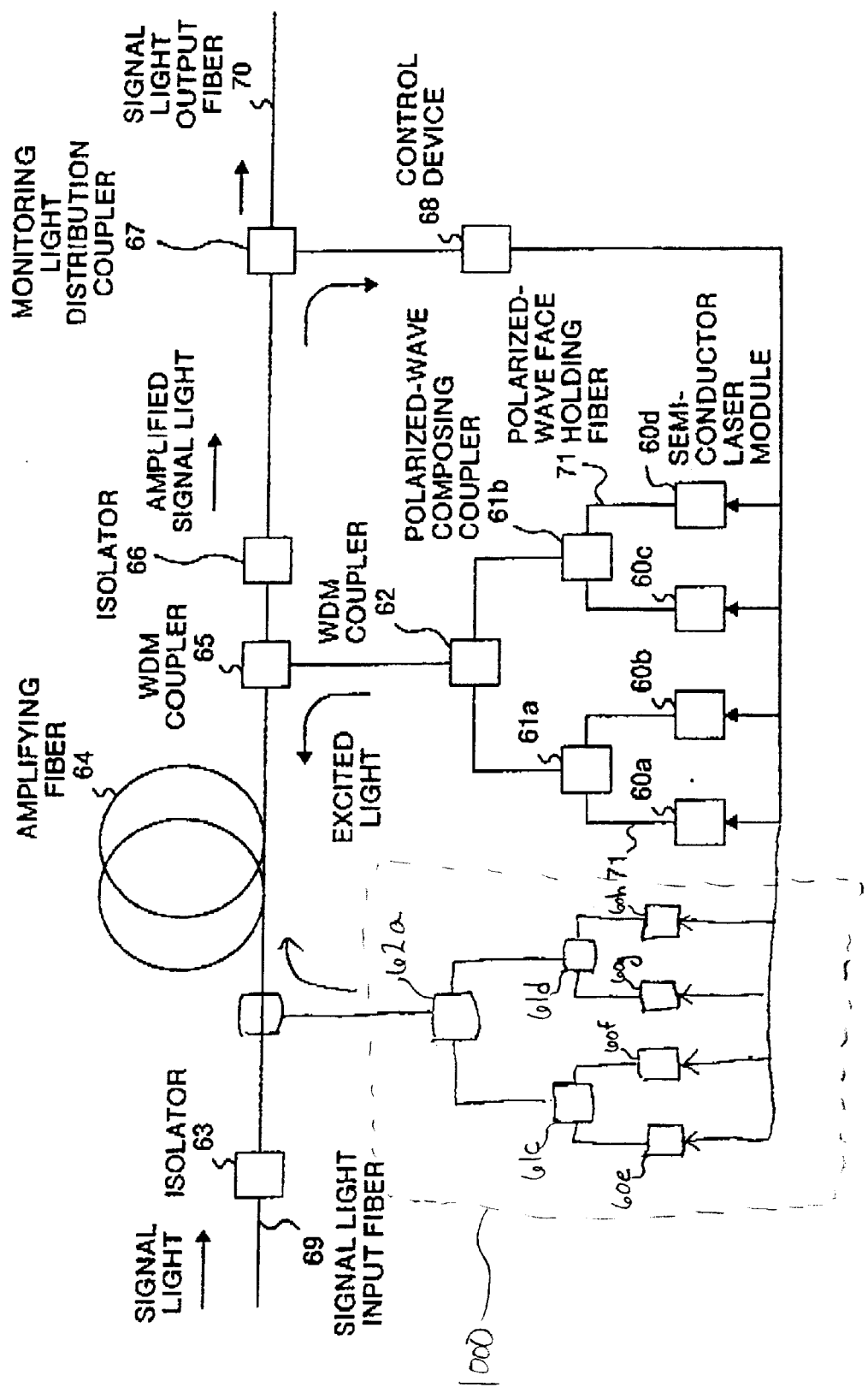
FIG. 21a is a block diagram showing a Raman amplifier having a forward pumping source and a backward pumping source in accordance with an embodiment of the present invention.
Figure 22:
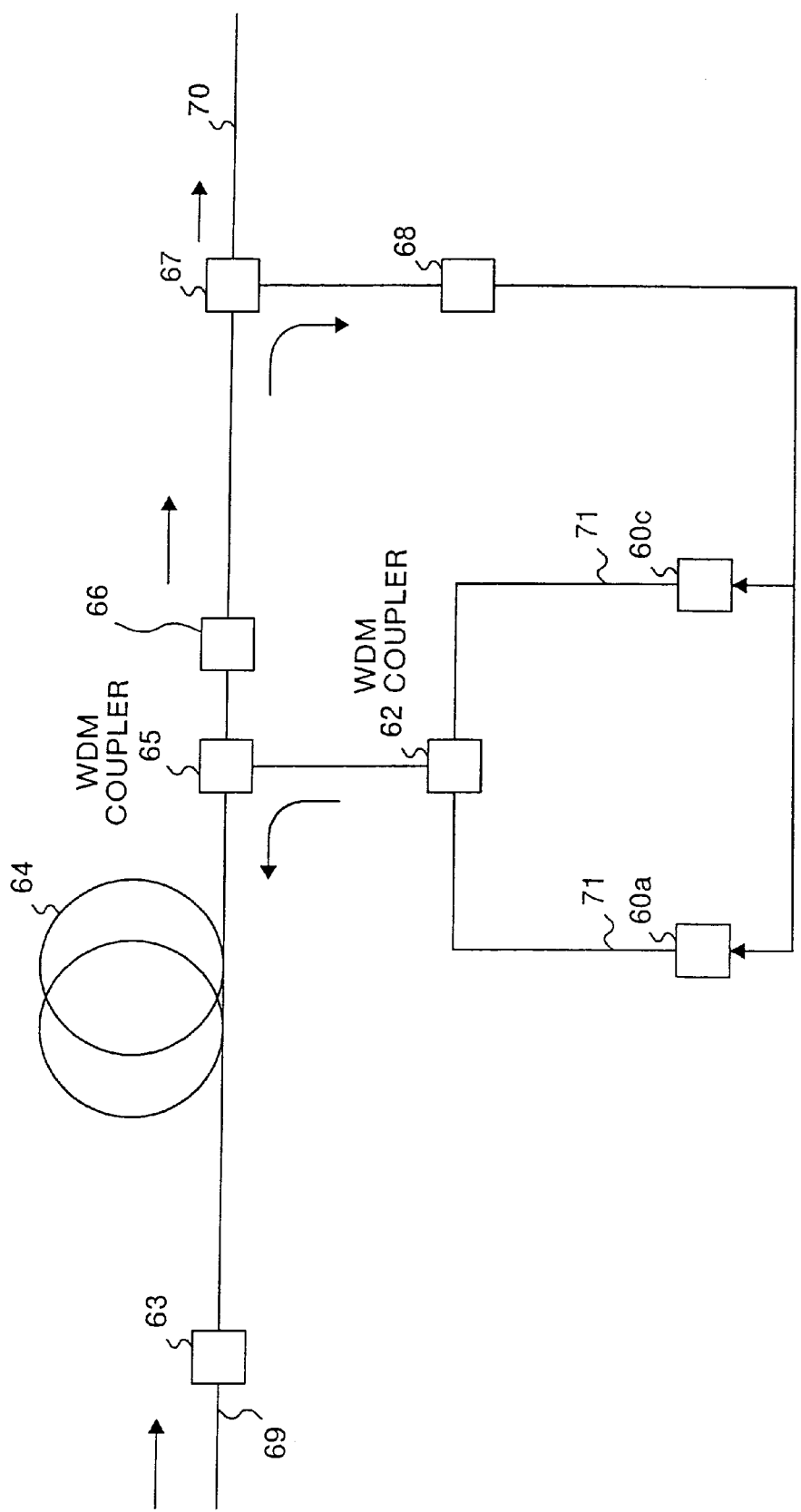
FIG. 22 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention.
Figure 23:
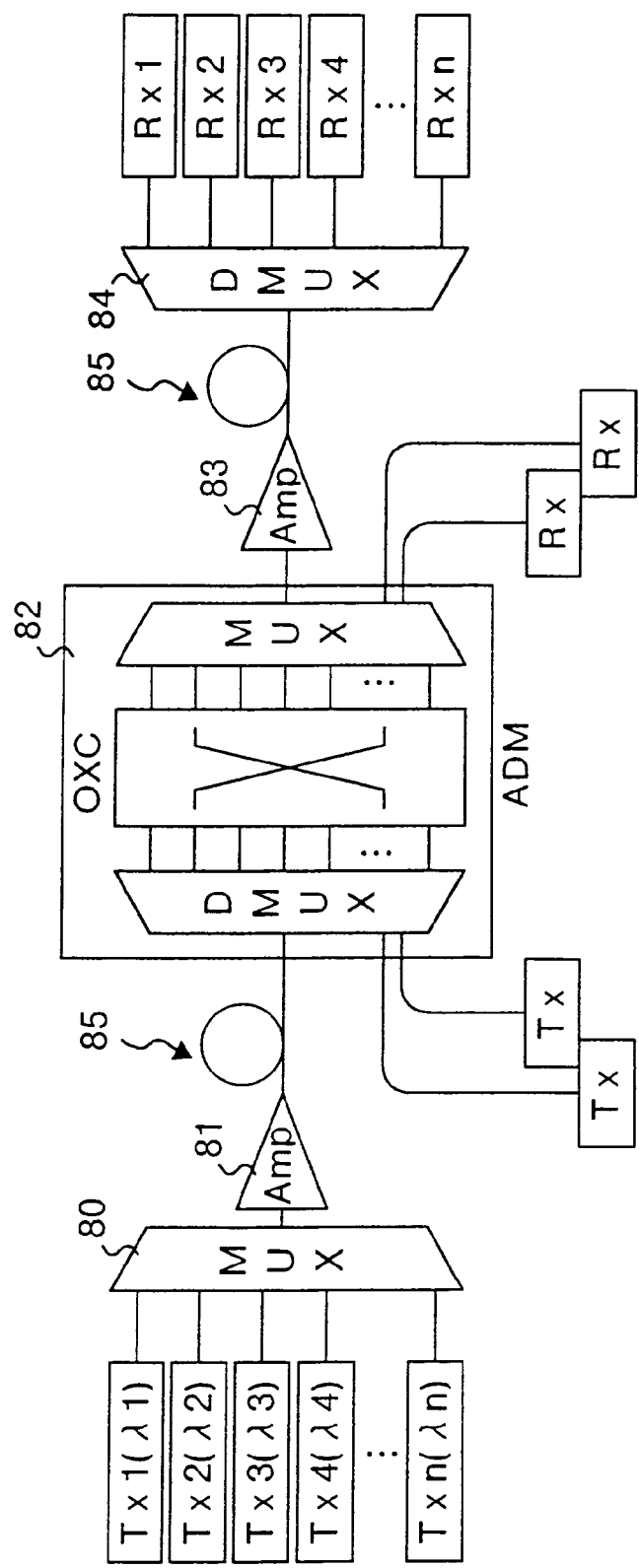
FIG. 23 is a block diagram illustrating a general configuration of a WDM communication system in which the Raman amplifier shown in FIG. 13 is used.

The Raman amplifier described in FIG. 21 realizes all of the advantages of the semiconductor laser device as previously described. For example, although the Raman amplifier illustrated in FIG. 23 is the backward pumping method, since the semiconductor laser modules 60a through 60d output stable pumping light beams, a stable Raman amplification can be performed whether the Raman amplifier is the forward pumping method or the bi-directional pumping method. FIG. 21a shows a Raman amplifier having a forward pumping source and a backward pumping source. The system of FIGS. 21a includes all of the elements of FIG. 21 except that the forward pumping source 1000. The forward pumping source 1000 includes semiconductor laser modules 60e, 60f, 60g, and 60h, as well as polarized wave composing couplers 61c and 61d, and WDM coupler 62a. These components function in the same way as their corresponding components in the backward pumping source previously described.

The Raman amplifier can be constructed by wavelength-multiplexing of a plurality of pumping light which are not polarization-multiplexed. That is, the semiconductor laser module of the present invention can be used in a Raman amplifier where the polarization-multiplexing of pumping light is not performed. FIG. 22 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees. As mentioned above, since at least 3 longitudinal modes are included in the predetermined spectral width of the output spectrum of the laser light, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier. Therefore, the laser device of the present invention provides a further advantage in that it is possible to substitute 2 units of laser modules which are polarization-multiplexed (as shown in FIG. 21) for one unit of depolarized laser module of greater power (as shown in FIG. 22), without deteriorating DOP and while obtaining a corresponding reduction in costs.

The Raman amplifier illustrated in FIGS. 21 and 22 can be applied to the WDM communication system as described above. FIG. 23 is a block diagram illustrating a general configuration of the WDM communication system to which the Raman amplifier shown in either FIG. 13 or FIG. 13A is applied.

In FIG. 23, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 21 or FIG. 22 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A semiconductor device comprising:
   an active layer configured to radiate light;
   a light reflecting facet positioned on a first side of said active layer;
   a light emitting facet positioned on a second side of said active layer thereby defining a resonator between said light reflecting facet and said light emitting facet; and
   a partial diffraction grating having a predetermined length, and integrated within the semiconductor laser device and positioned on a light emission side of said resonator, said predetermined length of said partial diffraction grating being selected to provide a light beam output having a predetermined spectral width that includes a plurality of longitudinal modes.

2. The semiconductor device of claim 1, wherein said predetermined length of said partial diffraction grating is set in relation to a length of said resonant cavity.

3. The semiconductor device of claim 1, wherein said predetermined length of said diffraction grating is set to meet the inequality:

$$Lg \times (1300/L) \leq 300 \ (\mu m),$$

where Lg is the predetermined length of the partial diffraction grating in $\mu m$, and L is the length of the resonant cavity in $\mu m$.

4. The semiconductor device of claim 2, wherein said predetermined length of said partial diffraction grating is not more than 300 $\mu m$.

5. The semiconductor device of claim 1, wherein said predetermined length of said partial diffraction grating is set in relation to a coupling coefficient of said diffraction grating.

6. The semiconductor device of claim 5, wherein said predetermined length of said diffraction grating is set to meet the inequality:

$$\kappa i \cdot Lg \leq 0.3,$$

where κi is the coupling coefficient of the diffraction grating, and Lg is the length of the diffraction grating.

7. The semiconductor device of claim 6, wherein said predetermined length of said diffraction grating is set to meet the inequality:

$$\kappa i \cdot Lg \leq 0.2.$$

8. The semiconductor device of claim 5, wherein said predetermined length of said diffraction grating is set such that:

$$\kappa i \cdot Lg = 0.1.$$

9. The semiconductor device of claim 5, wherein said predetermined length of said diffraction grating is set such that:

$$\kappa i \cdot Lg = 0.05.$$

10. The semiconductor device of claim 5, wherein
said partial diffraction grating has a thickness tgr, a distance from the active layer dsp, and a bandgap wavelength of diffraction grating λgr, and
and at least one of the parameters tgr, dsp, and λgr is a predetermined value such that the coupling coefficient κi is set in relation to the grating length Lg.

11. The semiconductor device of claim 2, wherein said partial diffraction grating comprises a plurality of grating elements having a constant pitch.

12. The semiconductor device of claim 2, wherein said diffraction grating comprises a chirped grating having a plurality of grating elements having fluctuating pitches.

13. The semiconductor device of claim 12, wherein said chirped grating is formed such that a fluctuation in the pitch of said plurality of grating elements is a random fluctuation.

14. The semiconductor device of claim 12, wherein said chirped grating is formed such that a fluctuation in the pitch of said plurality of grating elements is a periodic fluctuation.

15. The semiconductor device of claim 5, wherein said partial diffraction grating comprises a plurality of grating elements having a constant pitch.

16. The semiconductor device of claim 5, wherein said diffraction grating comprises a chirped grating having a plurality of grating elements having fluctuating pitches.

17. The semiconductor device of claim 16, wherein said chirped grating is formed such that a fluctuation in the pitch of said plurality of grating elements is a random fluctuation.

18. The semiconductor device of claim 16 wherein said chirped grating is formed such that a fluctuation in the pitch of said plurality of grating elements is a periodic fluctuation.

19. A method for providing light from a semiconductor device comprising:
radiating light from an active layer of said semiconductor device;
providing a light reflecting facet positioned on a first side of said active layer;
providing a light emitting facet positioned on a second side of said active layer thereby defining a resonator between said light reflecting facet and said light emitting facet;
providing a partial diffraction grating having a predetermined length, and integrated within the semiconductor laser device and positioned on a light emission side of said resonator; and
selecting said predetermined length of said partial diffraction grating to provide a light beam output having a predetermined spectral width that includes a plurality of longitudinal modes.

20. The method of claim 19, wherein said step of selecting said predetermined length comprises setting said predetermined length of said partial diffraction grating in relation to a length of said resonant cavity.

21. The method of claim 20, wherein said step of setting said predetermined length comprises setting the predetermined to meet the inequality:

$$Lg \times (1300/L) \leq 300(\mu m),$$

where Lg is the predetermined length of the partial diffraction grating in μm, and L is the predetermined length of the resonant cavity in μm.

22. The method of claim 19, wherein said step of selecting said predetermined length comprises setting said predetermined length of said partial diffraction grating in relation to a coupling coefficient of said diffraction grating.

23. The method of claim 22, wherein said step of setting the predetermined length comprises setting the predetermined length of said diffraction grating to meet the inequality:

$$\kappa i \cdot Lg \leq 0.3,$$

where κi is the coupling coefficient of the diffraction grating, and Lg is the length of the diffraction grating.

24. The method of claim 22, wherein said step of setting the predetermined length comprises setting the predetermined length of said diffraction grating to meet the inequality:

$$\kappa i \cdot Lg \leq 0.2.$$

25. The method of claim 22, wherein said step of setting the predetermined length comprises setting the predetermined length of said diffraction grating such that:

$$\kappa i \cdot Lg = 0.1.$$

26. The method of claim 22, wherein said step of setting the predetermined length comprises setting the predetermined length of said diffraction grating such that:

$$\kappa i \cdot Lg = 0.05.$$

27. The method of claim 22, further comprising setting at least one of a thickness tgr the partial diffraction grating, a distance dsp from the active layer to the partial diffraction grating, and a bandgap wavelength of diffraction grating λgr of the partial diffraction grating such that a coupling coefficient κi is set top a predetermined value.

28. The method of claim 20, wherein said step of providing a partial diffraction grating comprises forming said partial diffraction grating as a grating having a plurality of grating elements having a constant pitch.

29. The method of claim 20, wherein said step of providing a partial diffraction grating comprises forming said partial diffraction grating as a chirped grating having a plurality of grating elements having fluctuating pitches to thereby widen said predetermined spectral width of the oscillation wavelength spectrum.

30. The method of claim 29, wherein said step of forming said chirped grating comprises forming the chirped grating such that a fluctuation in the pitch of said plurality of grating elements is a random fluctuation.

31. The method of claim 29, wherein said step of forming said chirped grating comprises forming the chirped grating such that a fluctuation in the pitch of said plurality of grating elements is a periodic fluctuation.

32. The method of claim 22, wherein said step of providing a partial diffraction grating comprises forming said partial diffraction grating as a grating having a plurality of grating elements having a constant pitch.

33. The method of claim 22, wherein said step of providing a partial diffraction grating comprises forming said partial diffraction grating as a chirped grating having a plurality of grating elements having fluctuating pitches to thereby widen said predetermined spectral width of the oscillation wavelength spectrum.

34. The method of claim 33, wherein said step of forming said chirped grating comprises forming the chirped grating such that a fluctuation in the pitch of said plurality of grating elements is a random fluctuation.

35. The method of claim 33, wherein said step of forming said chirped grating comprises forming the chirped grating such that a fluctuation in the pitch of said plurality of grating elements is a periodic fluctuation.

36. A semiconductor device comprising:
- means for radiating light;
- means for reflecting said radiated light positioned on a first side of said means for radiating light;
- means for emitting light positioned on a second side of said means for radiating light to thereby form a resonant cavity between said means for reflecting light and said means for emitting light; and
- means for selecting a portion of said radiated light to be emitted by said semiconductor laser device as an output light beam; and
- means for ensuring said output light beam has an oscillation wavelength spectrum having a plurality of longitudinal modes located within a predetermined spectral width of the oscillation wavelength spectrum.

37. The semiconductor device of claim 36, further comprising means for ensuring that the plurality of longitudinal modes within a predetermined spectral width of an oscillation wavelength spectrum of the semiconductor device are maintained substantially over an entire current driving range of the semiconductor device.

38. A semiconductor laser module comprising:
- a semiconductor laser device comprising:
  - an active layer configured to radiate light;
  - a light reflecting facet positioned on a first side of said active layer;
  - a light emitting facet positioned on a second side of said active layer thereby defining a resonator between said light reflecting facet and said light emitting facet; and
  - a partial diffraction grating having a predetermined length, and integrated within the semiconductor laser device and positioned on a light emission side of said resonator, said predetermined length of said partial diffraction grating being selected to provide a light beam output having a predetermined spectral width that includes a plurality of longitudinal modes; and
- a wave guide device for guiding said laser beam away from the semiconductor laser device.

39. The semiconductor laser module of claim 38, further comprising an internal isolator interposed between said semiconductor laser device and said wave guide device.

40. The semiconductor laser module of claim 38, further comprising a temperature control device configured to control a temperature of the semiconductor laser device.

41. An optical fiber amplifier comprising:
- a semiconductor laser device comprising:
  - an active layer configured to radiate light;
  - a light reflecting facet positioned on a first side of said active layer;
  - a light emitting facet positioned on a second side of said active layer thereby defining a resonator between said light reflecting facet and said light emitting facet; and
  - a partial diffraction grating having a predetermined length, and integrated within the semiconductor laser device and positioned on a light emission side of said resonator, said predetermined length of said partial diffraction grating being selected to provide a light beam output having a predetermined spectral width that includes a plurality of longitudinal modes; and
- an amplifying fiber coupled to said semiconductor laser device and configured to amplify a signal by using said light beam as an excitation light.

42. A wavelength division multiplexing system comprising:
- a transmission device configured to provide a plurality of optical signals having different wavelengths;
- an optical fiber amplifier coupled to said transmission device and including a semiconductor laser device comprising:
  - an active layer configured to radiate light;
  - a light reflecting facet positioned on a first side of said active layer;
  - a light emitting facet positioned on a second side of said active layer thereby defining a resonator between said light reflecting facet and said light emitting facet; and
  - a partial diffraction grating having a predetermined length, and integrated within the semiconductor laser device and positioned on a light emission side of said resonator, said predetermined length of said partial diffraction grating being selected to provide a light beam output having a predetermined spectral width that includes a plurality of longitudinal modes; and
- a receiving device coupled to said optical fiber amplifier and configured to receive said plurality of optical signals having different wavelengths.

43. A Raman amplifier comprising:
a semiconductor laser device comprising:
- an active layer configured to radiate light;
- a light reflecting facet positioned on a first side of said active layer;
- a light emitting facet positioned on a second side of said active layer thereby defining a resonator between said light reflecting facet and said light emitting facet; and
- a partial diffraction grating having a predetermined length, and integrated within the semiconductor laser device and positioned on a light emission side of said resonator, said predetermined length of said partial diffraction grating being selected to provide a light beam output having a predetermined spectral width that includes a plurality of longitudinal modes; and
- a fiber coupled to said semiconductor laser device and configured to carry a signal that is amplified based on said light beam being applied to said fiber.

44. The Raman amplifier of claim 43, wherein said semiconductor laser device is coupled to said fiber at an input side of said fiber such that said light beam is applied in a forward pumping method.

45. The Raman amplifier of claim 43, wherein said semiconductor laser device is coupled to said fiber at an output side of said fiber such that said light beam is applied in a backward pumping method.

46. The Raman amplifier of claim 43, wherein said semiconductor laser device is coupled to said fiber at both an input and output side of said fiber such that said light beam is applied in both a forward and backward pumping method.

* * * * *